(12) United States Patent
Ikeda et al.

(10) Patent No.: US 8,920,562 B2
(45) Date of Patent: Dec. 30, 2014

(54) FILM FORMATION APPARATUS, FILM FORMATION METHOD, MANUFACTURING APPARATUS, AND METHOD FOR MANUFACTURING LIGHT-EMITTING DEVICE

(71) Applicant: Semiconductor Energy Laboratory Co., Ltd., Kanagawa-ken (JP)

(72) Inventors: Hisao Ikeda, Kanagawa (JP); Tomoya Aoyama, Kanagawa (JP); Takahiro Ibe, Kanagawa (JP); Yoshiharu Hirakata, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/679,391

(22) Filed: Nov. 16, 2012

(65) Prior Publication Data
US 2013/0074763 A1 Mar. 28, 2013

Related U.S. Application Data

(62) Division of application No. 11/949,217, filed on Dec. 3, 2007, now Pat. No. 8,313,603.

(30) Foreign Application Priority Data
Dec. 5, 2006 (JP) .................................. 2006-328472

(51) Int. Cl.
*C23C 14/08* (2006.01)
*C23C 14/28* (2006.01)
(Continued)

(52) U.S. Cl.
CPC .............. *B05C 11/00* (2013.01); *C23C 14/568* (2013.01); *C23C 14/26* (2013.01); *H01L 51/56* (2013.01); *H01L 51/0081* (2013.01); *C23C 14/28* (2013.01); *C23C 14/12* (2013.01); *C23C 14/042* (2013.01)
USPC ........... 118/719; 118/720; 118/724; 118/725; 118/50.1; 118/641

(58) Field of Classification Search
USPC .......... 156/382, 499, 540; 118/719, 725, 728, 118/720, 724, 50.1, 641
See application file for complete search history.

(56) References Cited

U.S. PATENT DOCUMENTS 4,975,299 A 12/1990 Mir et al.
5,782,253 A * 7/1998 Cates et al. .................... 134/105
(Continued)

FOREIGN PATENT DOCUMENTS

EP 0 883 190 A2 12/1998
JP 11-54275 2/1999
(Continued)

OTHER PUBLICATIONS

Hwang, C.C., "47.3: Plane Source and In-Line Deposition System for OLED Manufacturing," SID Digest '06: SID International Symposium Digest of Technical Papers, vol. 37, Jun. 6, 2006, pp. 1567-1570.
(Continued)

Primary Examiner — Michael Tolin
(74) Attorney, Agent, or Firm — Husch Blackwell LLP

(57) ABSTRACT

An object is to improve use efficiency of an evaporation material, to reduce manufacturing cost of a light-emitting device, and to reduce manufacturing time needed for a light-emitting device including a layer containing an organic compound. The pressure of a film formation chamber is reduced, a plate is rapidly heated by heat conduction or heat radiation by using a heat source, a material layer on a plate is vaporized in a short time to be evaporated to a substrate on which the material layer is to be formed (formation substrate), and then the material layer is formed on the formation substrate. The area of the plate that is heated rapidly is set to have the same size as the formation substrate and film formation on the formation substrate is completed by one application of heat.

16 Claims, 18 Drawing Sheets

(51) Int. Cl.
*B05C 11/00* (2006.01)
*C23C 14/56* (2006.01)
*C23C 14/26* (2006.01)
*C23C 14/12* (2006.01)
*C23C 14/04* (2006.01)
*H01L 51/56* (2006.01)
*H01L 51/00* (2006.01)

(56) References Cited

U.S. PATENT DOCUMENTS

| | | | |
|---|---|---|---|
| 5,840,147 A | 11/1998 | Grimm | |
| 5,851,709 A * | 12/1998 | Grande et al. | 430/7 |
| 5,904,961 A | 5/1999 | Tang et al. | |
| 5,937,272 A | 8/1999 | Tang | |
| 6,165,543 A | 12/2000 | Otsuki et al. | |
| 6,283,060 B1 | 9/2001 | Yamazaki et al. | |
| 6,566,032 B1 * | 5/2003 | Boroson et al. | 430/200 |
| 6,689,492 B1 | 2/2004 | Yamazaki et al. | |
| 6,776,847 B2 * | 8/2004 | Yamazaki et al. | 118/724 |
| 2003/0072876 A1 | 4/2003 | Chung | |
| 2003/0148021 A1 * | 8/2003 | Ishizuka | 427/66 |
| 2004/0065902 A1 | 4/2004 | Yamazaki et al. | |
| 2004/0077113 A1 * | 4/2004 | Yamazaki et al. | 438/29 |
| 2004/0089232 A1 * | 5/2004 | Sasaki et al. | 118/620 |
| 2005/0005848 A1 | 1/2005 | Yamazaki et al. | |
| 2005/0084712 A1 | 4/2005 | Kido et al. | |
| 2005/0145326 A1 | 7/2005 | Hatwar | |
| 2006/0146329 A1 * | 7/2006 | Jung et al. | 356/401 |
| 2007/0000487 A1 | 1/2007 | Sakata | |

FOREIGN PATENT DOCUMENTS

| | | |
|---|---|---|
| JP | 2000-77182 | 3/2000 |
| JP | 2000-256877 | 9/2000 |
| JP | 2002-302759 | 10/2002 |
| JP | 2003-308974 | 10/2003 |
| JP | 2004-342455 | 12/2004 |
| JP | 2006-228649 | 8/2006 |
| WO | WO 2005/069398 A2 | 7/2005 |

OTHER PUBLICATIONS

International Search Report re application No. PCT/JP2007/073535, dated Mar. 25, 2008.
Written Opinion re application No. PCT/JP2007/073535, dated Mar. 25, 2008.

* cited by examiner

FILM FORMATION APPARATUS, FILM FORMATION METHOD, MANUFACTURING APPARATUS, AND METHOD FOR MANUFACTURING LIGHT-EMITTING DEVICE

This application is a divisional of U.S. application Ser. No. 11/949,217, filed on Dec. 3, 2007 now U.S. Pat. No. 8,313,603.

TECHNICAL FIELD

The present invention relates to a film formation apparatus that is used for film formation of a material that can be formed on a substrate and a manufacturing apparatus including the film formation apparatus. The present invention further relates to a film formation method with the use of the film formation apparatus. Moreover, the present invention relates to a light-emitting device including, as a light-emitting layer, a layer containing an organic compound that is formed by the film formation apparatus, and a method for manufacturing the light-emitting device.

BACKGROUND ART

A light-emitting element containing an organic compound as a luminous body, which has features such as thinness, lightness, high-speed response, and DC drive at a low voltage, is expected to be applied to a next-generation flat panel display. In particular, a display device in which light-emitting elements are arranged in matrix is considered to have advantages in a wide viewing angle and excellent visibility over a conventional liquid crystal display device.

A light-emitting mechanism of a light-emitting element is as follows: a voltage is applied between a pair of electrodes where a layer containing an organic compound is interposed, electrons injected from a cathode and holes injected from an anode are recombined with each other at an emitting center of the organic compound layer to form molecular excitons, the molecular excitons release energy in returning to a ground state to emit light. Singlet excitation and triplet excitation are known as excited states, and light emission can probably be achieved through either of the excited states.

For a light-emitting device in which such light-emitting elements are arranged in matrix, a driving method such as passive matrix driving (simple matrix type) or an active matrix driving (active matrix type) can be used. However, when the pixel density is increased, the active matrix type where each pixel (or each dot) is provided with a switch is considered to be advantageous because it can be driven at a lower voltage.

The layer containing an organic compound has a structure typified by a stacked structure of a hole transporting layer, a light-emitting layer, and a electron transporting layer. EL materials for forming EL layers are roughly classified into low molecular (monomer) materials and high (polymer) molecular materials. An evaporation apparatus is used for film formation of the low molecular material.

A conventional evaporation apparatus includes a substrate is set on a substrate holder, and a crucible (or an evaporation boat) in which an EL material, that is, an evaporation material is sealed, a shutter to prevent the rising of a sublimating EL material, and a heater to heat the EL material in the crucible. Then, the EL material heated by the heater sublimates to form a film on the rotating substrate. At this time, a certain distance between the substrate and the crucible is needed in order to form a uniform film. For example, in a case of using a substrate having a size of 300 mm×360 mm, a distance of less than or equal to 1 m is needed. The larger the size of the substrate is, the longer distance is needed between the substrate and the crucible. The conventional evaporation apparatus requires a long distance between the substrate and the evaporation source in this manner; therefore, film formation speed is low and exhaust air in a film formation chamber takes a long time to lower throughput Furthermore, in the conventional evaporation apparatus and a conventional evaporation method, in forming the EL layer by evaporation, most of the EL material that sublimates adheres to an inner wall of a film formation chamber included in the evaporation apparatus, the shutter, or a contamination shield (protection plate to prevent an evaporation material from adhering to the inner wall of the film formation chamber). Therefore, use efficiency of an expensive EL material is as extremely low as about 1% to increase manufacturing cost of the light-emitting device. In addition, regular maintenance such as cleaning to remove the EL materials that has adhered the inner wall of a film formation chamber and the contamination shield is needed; the maintenance involves temporary suspension of a partial manufacturing line even in a case of mass production.

Moreover, the conventional evaporation apparatus includes a film thickness monitor to obtain a uniform film. After an evaporation speed measured by the film thickness monitor becomes stable, evaporation to the substrate is begun with the shutter opened. Thus, there are loss of time taken until the evaporation speed stabilizes and loss of the evaporation material caused by the extra vaporization thereof.

Furthermore, in a case of using a large-area substrate, since the center of the substrate and the periphery thereof each have a different distance from the evaporation source, there is a problem in that film thickness tends to be uneven in these parts of the substrate. In addition, the evaporation apparatus that has a structure in which the substrate is rotated has a limit as an evaporation apparatus for the purpose of using a large-area substrate.

Moreover, in a case of forming and stacking of EL layers, since the conventional evaporation apparatus requires a certain distance between the substrate and the crucible, chambers each have a large capacity. Accordingly, after film formation of a first EL layer is completed, film formation of a second EL layer may cause the material of the first EL layer to enter the second EL layer.

Patent document 1 (: Japanese Published Patent Application No. 2000-77182 bulletin Japanese Published Patent Application No. 2000-77182) discloses a technique in which an organic EL transfer substrate obtained by forming an organic compound having a light-emitting property on at least one surface of a heat-resistant film is heated by heat bars to transfer the organic compound having a light-emitting property to a transparent substrate having a transparent electrode.

Patent document 2 (: Japanese Published Patent Application No. 2003-308974 bulletin Japanese Published Patent Application No. 2003-308974) discloses a technique in which a donor sheet including a chromogenic organic donor layer and a substrate that are in contact with each other are irradiated with radiant ray to form an organic material layer on the substrate.

DISCLOSURE OF INVENTION

The present invention provides a film formation apparatus included in a manufacturing apparatus and a film formation method that reduce manufacturing cost by improvement in use efficiency of a material, which is not limited to an EL material, and are excellent in uniformity of film formation and throughput. As for the uniformity of film formation in particular, it is an object of the present invention to set a range of variations in film thickness to less than 3%.

The present invention provides a film formation apparatus which can realize the uniformity of film formation even without using a film thickness monitor.

Since evaporation is performed in a vacuum, there are problems in that evacuation of a film formation chamber takes a long time, time required for each step varies from treatment chamber to treatment chamber, and the like; thus, designing as an automation process is difficult and improvement in productivity is limited. In particular, evaporation and stacking of layers each containing an organic compound take a long time; accordingly, reducing treatment time per substrate is limited. Accordingly, it is another object of the present invention to reduce treatment time per substrate.

The present invention provides a film formation apparatus that eliminates bend of a substrate to obtain uniform film thickness on the entire surface of the substrate for a large substrate having a size of, for example, 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm.

It is another object of the present invention to provide a light-emitting device manufactured by using the film formation apparatus through the film formation method of the present invention and a method for manufacturing the same.

It is a still another object of the present invention to provide a small-sized film formation apparatus that has a smaller chamber capacity compared to a conventional evaporation apparatus having a large capacity. Reducing a chamber capacity realizes a film formation apparatus capable of responding to increase in the area of a substrate on which a material layer is to be formed.

A film formation apparatus of the present invention includes, in a film formation chamber in which the pressure can be reduced, at least a plate on which a material layer is formed, a substrate on which the material layer is to be formed (formation substrate), and a heat source (e.g., a hot plate, a flash lamp). The plate on which a material layer is formed and the formation substrate are disposed to face each other. A material layer surface and a surface (formation surface) of the formation substrate, on which the material layer is to be formed, are set to face each other. Further, the film formation apparatus of the present invention has a mechanism to adjust the arrangement so that a distance d between the formation surface is less than or equal to 100 mm, preferably less than or equal to 5 mm, on the basis of the distance that does not allow the material layer surface and the formation surface to be directly in contact with each other. It is to be noted that the material layer surface and the formation surface are desirably disposed parallel to each other.

The distance d is defined as a distance to the formation surface on the basis of the average height of film thickness of the material layer formed on the plate in a case where the material layer surface has unevenness.

The pressure is reduced in the film formation chamber, the plate is rapidly heated by heat conduction or heat radiation using the heat source, the material layer on the plate is evaporated in a short time to be evaporated to the formation substrate, and then the material layer is formed.

In accordance with the present invention, use efficiency of an evaporation material and throughput can be remarkably improved.

A mask having openings may be provided between the plate on which the material layer is formed and the formation substrate. Selective film formation is possible by using the mask. In particular, in the present invention, because a distance between the material layer formed on the plate and the formation substrate is small, expansion of evaporation is suppressed to prevent evaporation involving an unwanted material entering through the mask. The evaporation involving an unwanted material entering through a mask refers to that film formation is performed in more regions than opening regions of a mask. In a conventional evaporation apparatus, the evaporation involving an unwanted material entering through a mask tends to be caused since a distance between an evaporation source and a substrate to which the evaporation source is to be evaporated is as long as 1 m, and thus, it is difficult to obtain a minute film formation pattern.

According to one aspect of the present invention disclosed in this specification, a film formation apparatus that is a face-down film formation apparatus includes a formation chamber and a vacuum evacuation treatment chamber to evacuate the film formation chamber. The film formation apparatus includes, in the film formation chamber, a heat source, a first substrate supporting unit over the heat source, and a second substrate supporting unit at a position where it faces the first substrate supporting unit. A material layer is formed on one flat surface of a first substrate set on the first substrate supporting unit, the first substrate is heated by application of heat using the heat source from the other flat surface of the first substrate, and the material layer is formed on the lower surface of a second substrate facing downward opposite to the first substrate.

With the above structure, at least one of the problems can be resolved.

In addition to the above structure, a cooling unit to cool the second substrate or a heating unit to heat the second substrate may be provided. The degree of freedom in stacking the material layer becomes higher with the cooling unit to cool the second substrate. For example, organic materials having different evaporation temperatures can be formed and stacked on the formation substrate. In addition, a flexible substrate such as a plastic substrate can be used as the second substrate with the cooling unit to cool the second substrate.

The film formation apparatus of the present invention can be a face-up film formation apparatus. According to another aspect of the present invention disclosed in this specification, a film formation apparatus includes a film formation chamber and an evacuation treatment to evacuate the formation chamber. The film formation apparatus includes, in the film formation chamber, a first substrate supporting unit, a second substrate supporting unit at the position where it faces the first substrate supporting unit, and a heat source over the second substrate supporting unit. A material layer is formed on one flat surface of a second substrate set on the second substrate supporting unit, the second substrate is heated by application of heat using the heat source from the other flat surface of the substrate, and the material layer is formed on an upper flat surface of the first substrate facing upward opposite to the second substrate.

With the above structure, at least one of the problems can be resolved.

In addition to the above structure, a cooling unit to cool the first substrate or a heating unit capable of heating the first substrate may be provided. The degree of freedom in stacking the material layer becomes higher with the cooling unit to cool the first substrate. For example, organic materials having different evaporation temperatures can be formed and stacked on the formation substrate. In addition, a flexible substrate such as a plastic substrate can be used as the first substrate with the cooling unit to cool the first substrate.

When a large-area substrate is used for evaporation in a conventional face-down system, the center of a substrate bends due to own weight of the substrate to decrease adhesion between the substrate and the mask; accordingly, adhesion differences in the entire substrate surface may cause variations in a pattern.

Thus, it is another object of the present invention to provide a film formation apparatus that eliminates bend of the formation substrate by disposing the formation substrate in perpendicular with respect to a horizontal area and a distance between the formation substrate and the plate is reduced to less than or equal to 100 mm, preferably less than or equal to 5 mm, to remarkably improve use efficiency of an evaporation material and throughput.

According to another aspect of the present invention disclosed in this specification, a film formation apparatus including a formation chamber and a vacuum evacuation treatment chamber of the formation chamber; the film formation apparatus includes, in the film formation chamber, a heat source, a transfer unit to transfer the first substrate while keeping vertical placement of the first substrate, a first substrate supporting unit to support (hold) the first substrate while keeping the vertical placement, and, between the heat source and the first substrate, a second substrate supporting unit to support the second substrate while keeping the vertical placement. A material layer (a first layer containing a material) is formed on one flat surface of a second substrate set on the second substrate supporting unit, the second substrate is heated by application of heat using the heat source, and the material layer (a second layer containing the same material as the first layer) is formed on a flat surface of the first substrate that faces the material layer formed on the second substrate.

With the above structure, at least one of the problems can be resolved.

The above described structures each correspond to an apparatus to realize a method, that is, surface evaporation, in which an evaporation material layer formed on a plate is heated using the heat source on a rear surface of the plate to more than or equal to the evaporation temperature under a low-pressure atmosphere to be instantly evaporated on a large-area surface of a formation substrate that faces the plate.

In the above film formation apparatus, film formation is possible around the evaporation temperature of the evaporation material because a distance between the evaporation material layer and the formation substrate is shorter compared to a conventional evaporation apparatus. It is to be noted that, in the above film formation apparatus, the temperature is desirably set as high as more than the evaporation temperature of the evaporation material and less than or equal to 50° C. In order to relieve influence of radiant heat of the heat source, the temperature can be set as low as within the above temperature range (it is to be noted that a temperature of more than or equal to the evaporation temperature is required) depending on the distance to the formation substrate or the material or thickness of the formation substrate.

In addition, in a case of an evaporation material that is a mixture of two or more materials, heating is desirably performed with the temperature that is higher than the highest evaporation temperature of those of the materials. Although, also in a case of the evaporation material that is a mixture of two or more materials, the temperature is desirably set as high as more than the evaporation temperature of the evaporation material and less than or equal to 50° C., the temperature may be set as low as within the above temperature range (it is to be noted that a temperature more than or equal to the highest evaporation temperature is required) considering the resolution temperature of the evaporation material having a low evaporation temperature, the distance to the formation substrate, and the material and thickness of the formation substrate.

The following substrates can be given as the plate: an oxide substrate of quartz, ceramic, sapphire, or the like; a conductive substrate formed using a material such as gold, platinum, copper, silver, tungsten, tantalum, titanium, or aluminum, or an alloy material made of these materials; a substrate obtained by forming the above-mentioned conductive substrate over the above-mentioned oxide substrate; and the like. In addition, a conductive substrate formed using a semiconductor material such as silicon or germanium can be used as the plate. Alternatively, a light transmitting substrate (e.g., a glass substrate, a quartz substrate, or a plastic substrate containing an inorganic material) over which an amorphous silicon film or a microcrystalline silicon film is formed may be used as the plate. A flash lamp or the like can uniformly heat the material layer on the plate, because light is efficiently absorbed.

For a material to be formed on the plate, the following materials can be given: a film formation material obtained by evaporation, sputtering, spin coating, printing, ink jetting, spraying, dropping, dispensing, or the like; high molecular materials containing the film formation material; and the inorganic material containing the film formation material.

A conductive material layer formed on the conductive substrate or a conductive material layer on an oxide substrate may be selectively removed to be patterned as the plate on which the material layer is formed. When the material layer obtained by evaporation, sputtering, spin coating, printing, ink jetting, spraying, dropping, dispensing, or the like is formed on this pattered plate, only predetermined part of the first material is intensively heated to realize selective film formation. For this case, the distance to the formation substrate is desirably short.

As well as the above-described structures, an alignment unit to align the mask and the substrate may be provided in the film formation chamber to perform film formation with high alignment accuracy. In addition, as well as the above-described structures, a distance adjusting unit to adjust a distance between the substrates may be provided in the film formation chamber. For the distance adjusting unit, a cylinder, a linkage mechanism, a cam mechanism, or the like is used.

Patent document 1 discloses the technique in which heat is applied by a plurality of heat bars. However, in the technology, the substrate is partially heated and the heated region is belt-shaped having a shorter width than one side of the substrate; thus, a heat range is greatly different from the scope of the present invention. Also in the technology, as film formation process of one transparent substrate, evaporation in which the transparent substrate and an organic EL transfer substrate are slid to be aligned and heat is again applied by the heat bars is repeated.

In accordance with the present invention, a large area of the substrate is heated uniformly and one substrate is heated by one application of heat for film formation process. It is needless to say that the alignment is performed only once; consequently, film formation time can be extremely reduced. Furthermore, the plate area can be increased; in this case, film formation can be performed in a short time with a plurality of formation substrates that face the large area plate arranged. In addition, in the case of increasing the plate area, the heated range is accordingly increased.

Moreover, Patent Document 2 discloses the technique in which a donor sheet having a chromogenic organic donor layer and a substrate that are in contact with each other are irradiated with radiant ray to form an organic material layer.

This technology and the present invention are largely different because, in the film formation apparatus of the present invention, the surfaces that are face each other has a distance so as not to be in contact with each other.

The present invention also discloses novel film formation methods. According to one method of the film formation methods, a material layer is coated onto one surface of a first substrate, one surface of a second substrate is disposed so as to face one surface of the first substrate, the other surface of the first substrate is heated, and the material layer is formed on the other surface of the second substrate. It is to be noted that a heated area through one film formation process is about the same as the area of the first substrate.

Further, according to another method of the film formation methods, a material layer is selectively formed on one surface of a first substrate, one surface of a second substrate is disposed so as to face one surface of the first substrate, the other surface of the first substrate is heated, and the material layer is formed on the other surface of the second substrate. It is to be noted that a heated area through one film formation process is about the same as the area of the first substrate.

Further, according to still another method of the film formation methods, a thermal conductive layer is selectively formed on one surface of a first substrate, one surface of a second substrate is disposed so as to face one surface of the first substrate, the other surface of the first substrate is heated, and the material layer is selectively formed on the other surface of the second substrate. It is to be noted that a heated area through one film formation process is about the same as the area of the first substrate.

In the above film formation methods, the heat source has a larger area than one surface of the first substrate; thus, a material layer having a larger area can be formed in a short time. In these film formation methods, the other surface of the first substrate is heated by a method in which the heat source is approached or by using a lamp.

The present invention further provides novel method for manufacturing a light-emitting device. According to this method, a layer containing an organic compound is formed on one surface of a first substrate; a heat source is heated; a second substrate having one surface facing the heat source, provided with a first electrode, is retained; the other surface of the first substrate is heated to vaporize the layer containing an organic compound; the material layer containing an organic compound is formed on the first electrode; and a second electrode is formed on the material layer containing an organic compound. This method enables manufacture of the light-emitting device in a short time.

In the above method for manufacturing a light-emitting device, the second electrode can also be formed by using the film formation apparatus of the present invention. In this case, a layer containing a conductive material is selectively formed on one surface of a third substrate; the heat source is heated; the second substrate having one surface facing the heat source, provided with a stack of the first electrode and the material layer containing an organic compound, is retained; the other surface of the second substrate is heated to vaporize the layer containing a conductive material; and the second electrode is formed on the material layer containing an organic compound. This method enables manufacture of the light-emitting device in a short time.

The film formation apparatus and the film formation method disclosed in this specification are not limited to manufacture of light-emitting devices but applied to formation of various films. For example, pentacene to serve as an active layer of an organic transistor can be formed in a short time.

According to the present invention, improvement in use efficiency of a material can reduce manufacturing cost. One film formation requires one exchange of an evaporation source (plate), and only the needed quantity of material is prepared on the formation substrate; thus, less waste is obtained. In addition, time for film formation process can be greatly shortened. Moreover, the first substrate (plate) can be reused.

Furthermore, a distance between the formation substrate and the plate is shortened to less than or equal to 100 mm, preferably, less than or equal to 5 mm, so that scattering of a material in a vacuum chamber can be suppressed. Therefore, the interval of maintenance such as cleaning of a film formation chamber can be lengthened.

BEST MODE FOR CARRYING OUT THE INVENTION

Embodiment modes of the present invention will be described below.

Embodiment Mode 1

A procedure of film formation will be described with reference to FIGS. 1A to 1C that are schematic cross-sectional views of a film formation apparatus of the present invention.

Figure 1A:
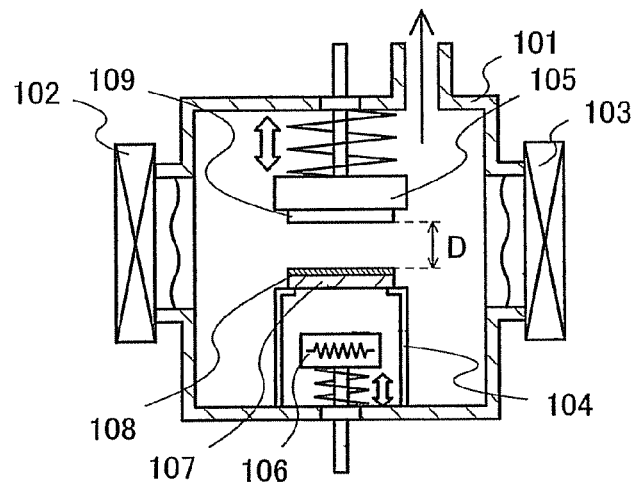
FIGS. 1A to 1C are views illustrating a cross-section of a film formation apparatus.

In FIG. 1A, a film formation chamber 101 is a vacuum chamber and connected to other treatment chambers through a first gate valve 102 and a second gate valve 103. In the film formation chamber 101, at least, a plate supporting mechanism which is a first substrate supporting unit 104, a supporting mechanism of a substrate on which a material layer 108 is to be formed (formation substrate), which is a second substrate supporting unit 105, and a heater capable of vertical movement as a heat source 106 are included.

First, in the other film formation chamber, a material layer 108 is formed on a plate that is a first substrate 107. Here, a flat square plate is used for the first substrate 107 and a material that can be evaporated is used for the material layer 108. In addition, for the first substrate 107, there is no particular limitation on its shape as long as it has the area of more than or equal to that of the formation substrate. Also, there is no particular limitation on a method for forming the material layer 108, so that evaporation, sputtering, spin coating, printing, ink jetting, or the like is used; above all, spin coating capable of film formation with high uniformity is preferable. In a case of employing spin coating, however, film formation may partially be performed on an end surface or a rear surface of the first substrate 107; therefore, the periphery of the first substrate 107 is desirably wiped with a cloth soaked with acetone to remove the material layer 108 in the periphery of the first substrate 107.

Subsequently, the first substrate 107 is transferred from the other film formation chamber to the film formation chamber 101 to be set on the plate supporting mechanism. The second substrate 109 is fixed to the substrate supporting mechanism so that the surface of the first substrate 107, on which the material layer 108 is formed, faces a surface of the second substrate 109, on which the material layer 108 is to be formed (formation surface). FIG. 1A illustrates a cross-sectional view at this stage and a reference numeral D denotes a distance between the first substrate 107 and the second substrate 109. As illustrated in FIG. 1A, this structure shows an example of a face-down system because the formation surface of the substrate faces downward.

Subsequently, as illustrated in, FIG. 1B, the second substrate supporting unit 105 is moved so that the distance D between the first substrate 107 and the second substrate 109 is reduced to be a distance d. Here, the distance d is set to 2 mm. If the second substrate 109 is hard like a quartz substrate and formed using a material that is not almost transformed (e.g., wrapped or bent), the second substrate supporting unit 105 can be moved until the distance d becomes 0.1 mm which is the lower limit. Further, in a case where an electrostatic chuck is used to prevent the substrate from wrapping and bending, the lower limit of the distance d can be set to 0.01 mm even if either a glass substrate or a quartz substrate is used. Although FIG. 1B illustrates an example in which the substrate supporting mechanism is moved with the plate supporting mechanism fixed, the plate supporting mechanism may be moved with the substrate supporting mechanism fixed. Alternatively, both the plate supporting mechanism and the substrate supporting mechanism may be moved to adjust the distance d.

The plate supporting mechanism and the substrate supporting mechanism may have a mechanism capable of not only vertical movement but also moving in a horizontal direction, and may have a structure for precise alignment. In addition, the film formation chamber 101 may include an alignment unit such as CCD for precise alignment or measurement of the distance d. In addition, a sensor to measure temperature or humidity in the film formation chamber 101 may be provided.

Figure 1B:
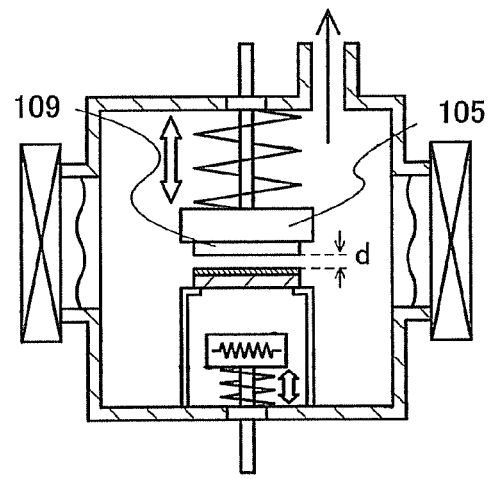
Figure 1C:
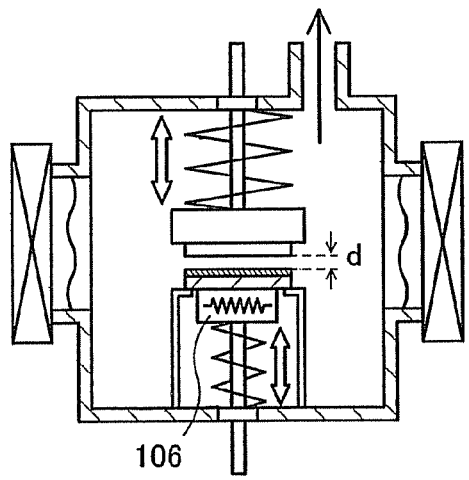

Subsequently, the heat source 106 is approached to the plate while retaining the distance d as illustrated in FIG. 1C. It is to be noted that the heat source 106 and the plate are desirably in contact with each other with a large area for uniform heating. In FIG. 1C, the heater capable of vertical movement under the plate is used. Although the heater is basically set to become constant at a predetermined temperature, the temperature may be controlled so that the temperature is raised or lowered in the range in which the takt time is not affected.

When the heat source 106 is approached to the plate, the material layer 108 on the plate is heated in a short time by direct thermal conduction to be evaporated, and then an evaporation material is formed on the formation surface (i.e., lower flat surface) of the second substrate 109 that is disposed to face the material layer 108. Film thickness uniformity of the film formation on the lower flat surface of the second substrate 109 can be set to less than 3%. When the material layer 108 is obtained on the first substrate 107 with a uniform film thickness beforehand in the film formation apparatus illustrated in FIG. 1C, film formation with high uniformity is possible on the second substrate 109 without using a film thickness monitor. Furthermore, the film formation is performed with the formation substrate stopped in the film formation apparatus illustrated in FIG. 1C while the formation substrate is rotated in a conventional evaporation apparatus; therefore, this film formation apparatus is suitable for film formation on a large-area glass substrate that is easy to be broken. In the film formation apparatus illustrated in FIG. 1C, the plate is also stopped during film formation.

In FIGS. 1A and 1B, the heat source 106 (heater) and the first substrate 107 (plate) may retain a long distance therebetween in order to relieve thermal effects that radiation of the heat source (heater) 106 has on the material layer 108 on the first substrate 107 (plate) at the time of waiting.

In the film formation apparatus illustrated in FIG. 1A, the capacity of the chamber can be greatly reduced in comparison with a conventional evaporation apparatus. An opening and shutting shutter for heat insulation may be provided between the heat source 106 and the first substrate 107 (plate) in order to reduce the capacity of the chamber.

Figure 2A:
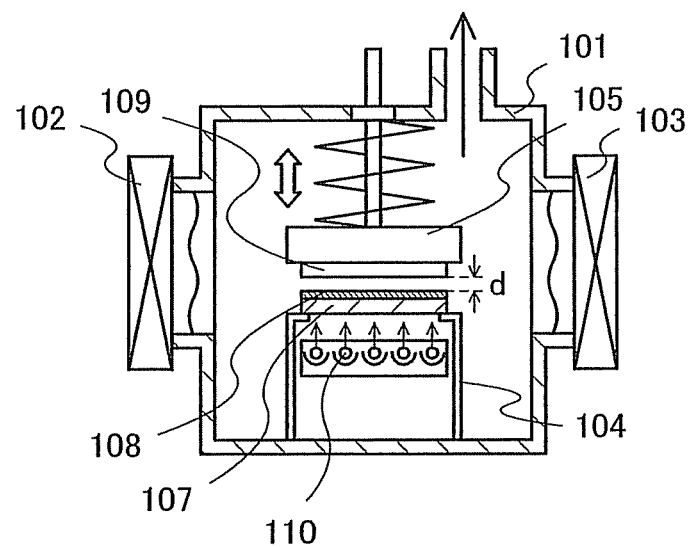
FIGS. 2A and 2B are views illustrating a cross-section of a film formation apparatus.

The heat source 106 may be a heating unit capable of uniform heating in a short time without being limited to a heater. For example, a lamp 110 may be provided as illustrated in FIG. 2A. It is to be noted that, in FIG. 2A, explanation will be made using the same reference numerals for the portions that are common to those in FIG. 1C. In an example illustrated in FIG. 2A, the lamp 110 is fixed under the first substrate 107, and, immediately after the lamp 110 is lit, the film formation is performed on the lower flat surface of the second substrate 109.

A discharge lamp such as a flash lamp (e.g., a xenon flash lamp and a krypton flash lamp), a xenon lamp, or a metal halide lamp; or an exothermic lamp such as a halogen lamp or a tungsten lamp can be used as the lamp 110. By the flash lamp, emission with extremely high intensity is repeated in a short time (0.1 to 10 msec) and emission in a large area is possible; thus, uniform and efficient heating is possible regardless of the area of the first substrate 107. In addition, the flash lamp can control heating of the first substrate 107 by changing the interval of emission time. In addition, the running cost can be suppressed because of a long life and low power consumption at the time of waiting for light emission of the flash lamp. In addition, immediate heating is easy by using the flash lamp to eliminate a vertical mechanism, a shutter, or the like in a case of using the heater. Thus, the film formation apparatus can be further miniaturized. However, a mechanism may be employed in which the flash lamp can vertically move for adjustment of the heating temperature depending on a material of the plate.

Although an example in which the lamp 110 is disposed inside of the film formation chamber 101 is illustrated in FIG. 2A, the lamp 110 may be disposed outside of the film formation chamber 101 with a light-transmitting member used for part of an inner wall of the film formation chamber 101. If the lamp 110 is disposed outside of the film formation chamber 101, maintenance such as exchange of a light valve of the lamp 110 can be simplified.

Figure 2B:
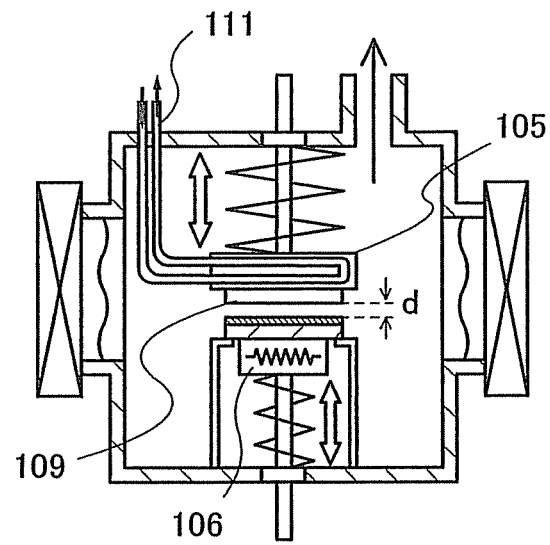

FIG. 2B illustrates an example of a film formation apparatus having a mechanism to control the temperature of the second substrate 109. In FIG. 2B, explanation will be made using the same reference numerals for the portions that are common to those in FIG. 1C. In FIG. 2B, a tube 111 by which a refrigerant flows to the second substrate supporting unit 105 is provided. The second substrate supporting unit 105 can be a cold plate by the tube 111 by which a refrigerant flows. The tube 111 has a mechanism in which it can follow the vertical movement of the second substrate supporting unit 105. It is to be noted that, although an example of the tube 111 by which a refrigerant gas or a liquid refrigerant flows is illustrated here, the second substrate supporting unit 105 may be provided with a peltiert element or the like as a cooling unit.

The film formation apparatus of FIG. 2B is useful for stacking evaporation films formed of material layers each having different evaporation temperatures. For example, in a case where a material layer having a first evaporation temperature has been formed of on the second substrate 109 beforehand, a material layer having a second evaporation temperature that is higher than the first evaporation temperature can be stacked thereon. In FIG. 1C, because the second substrate 109 and the first substrate 107 are close to each other, there is a possibility in that the material layer having the first evaporation temperature that has been formed on the second substrate 109 evaporates. However, when the film formation apparatus of FIG. 2B is employed, the material layer having the second evaporation temperature can be stacked while evaporation of the material layer having the first evaporation temperature that has been formed on the second substrate 109 is suppressed using the cooling unit.

In addition, the substrate supporting unit 105 may be provided with a heating unit such as a heater, as well as the cooling unit. A unit to adjust the temperature (to heat or to cool) of the second substrate 109 can prevent the substrate from wrapping.

A plurality of film formation apparatuses described in this embodiment mode can be provided to form a multi-chamber manufacturing apparatus. It is needless to say that film formation apparatuses of other film formation methods can be combined therewith. Alternatively, a plurality of film formation apparatuses described in this embodiment mode can be disposed in series to form an in-line manufacturing apparatus.

Embodiment Mode 2

Although an example of a face-down film formation apparatus is described in Embodiment Mode 1, here, an example of a face-up film formation apparatus will be described using FIG. 3A.

Figure 3A:
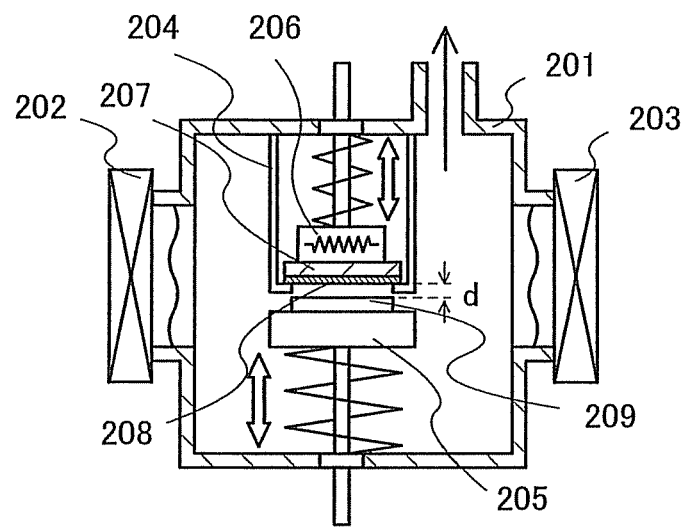
FIGS. 3A and 3B are views illustrating a cross-section of a film formation apparatus.

In FIG. 3A, a film formation chamber 201 is a vacuum chamber and connected to other treatment chambers through a first gate valve 202 and a second gate valve 203. In the film formation chamber 201, at least, a supporting unit of a substrate on which a material layer 208 is to be formed (formation substrate), which is a first substrate supporting unit 205, a plate supporting unit which is a second substrate supporting unit 204, and a heater capable of vertical movement as a heat source 206 are included.

As the procedure of film formation, first, in the other film formation chamber, a material layer 208 is formed on a plate that is a second substrate 207. For a second substrate 207, there is no particular limitation on its shape as long as it has the area of more than or equal to that of the formation substrate. Also, there is no particular limitation on a method for forming the material layer 208, so that evaporation, spin coating, printing, ink jetting, or the like is used; above all, spin coating capable of film formation with high uniformity is preferable.

Subsequently, the second substrate 207 is transferred from the other film formation chamber to the film formation chamber 201 to be set on the plate supporting mechanism. The first substrate 209 is fixed to the substrate supporting mechanism so that a surface of the second substrate 207, on which the material layer 208 is formed, faces a surface of the first substrate 209, on which the material layer 208 is to be formed (formation surface). As illustrated in FIG. 3A, this structure shows an example of a face-up system because the formation surface of the substrate faces upward. In a case of the face-up system, bend of a substrate can be prevented by putting a large-area glass substrate that tends to bend on a flat base or by supporting it with a plurality of pins to realize a film formation apparatus in which uniform film thickness can be obtained on the entire surface of the substrate.

Subsequently, the first substrate supporting unit 205 is moved so that the distance D between the second substrate 207 and the first substrate 209 is reduced to be a distance d. Here, the distance d is set to 5 mm. Although an example is described in which the substrate supporting mechanism is moved with the plate supporting mechanism fixed, the plate supporting mechanism may be moved with the substrate supporting mechanism fixed. Alternatively, both the plate supporting mechanism and the substrate supporting mechanism may be moved to adjust the distance d.

Subsequently, the heat source 206 is approached to be in contact with the plate while retaining the distance d as illustrated in FIG. 3A. It is to be noted that the heat source 206 and the plate are desirably in contact with each other with a large area for uniform heating. In FIG. 3A, the heater capable of vertical movement over the plate is used.

When the heat source 206 is approached to the plate, the material layer 208 on the plate is heated in a short time by direct heat conduction to be evaporated, and then an evaporation material is formed on the formation surface (i.e., an upper flat surface) of the first substrate 209 that is disposed to face the material layer 208. Film thickness uniformity of the film formation on the upper flat surface of the first substrate 209 can be set to less than 3%. Furthermore, it is possible to realize a compact film formation apparatus of which the capacity is largely smaller in comparison with a conventional evaporation apparatus having a large-capacity chamber.

Figure 3B:
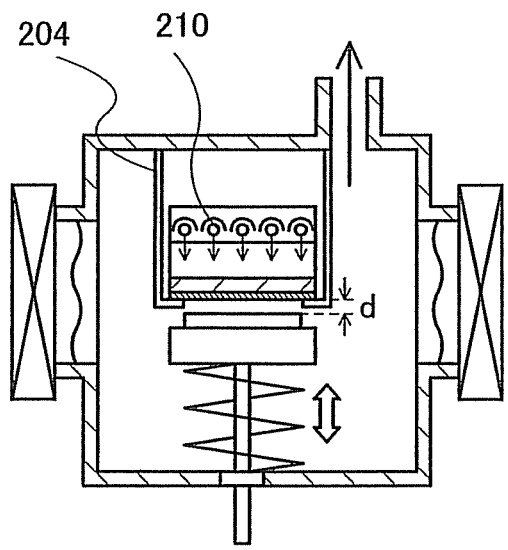

The heat source 206 may be a heating unit capable of uniform heating in a short time without being limited to a heater. For example, a lamp 210 may be provided as illustrated in FIG. 3B. It is to be noted that, in FIG. 3B, explanation will be made using the same reference numerals for the portions that are common to those in FIG. 3A. In an example illustrated in FIG. 3B, the lamp 210 is provided over the second substrate 207 to be fixed and, immediately after it is lit, film formation is performed on the upper flat surface of the first substrate 209.

A plurality of film formation apparatuses described in this embodiment mode can be provided to form a multi-chamber manufacturing apparatus. It is needless to say that a film formation apparatus using other film formation methods can be combined therewith. Alternatively, a plurality of film formation apparatuses described in this embodiment mode can be disposed in series to form an in-line manufacturing apparatus.

The film formation apparatus described in this embodiment mode has the same structure as that of Embodiment Mode 1 except for employing the face-up system; accordingly, this embodiment mode can be freely combined with Embodiment Mode 1.

Embodiment Mode 3

Figure 4:
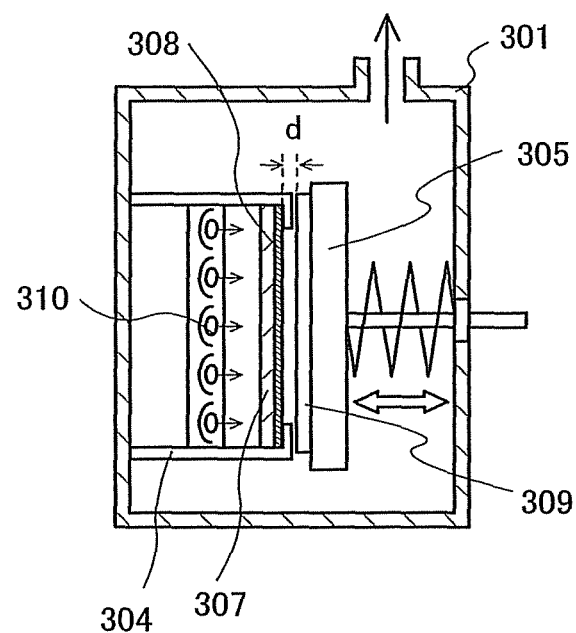
FIG. 4 is a view illustrating a cross-section of a film formation apparatus.

Although an example of the face-down film formation apparatus is described in Embodiment Mode 1, here, an example of a film formation apparatus employing vertical placement of a substrate will be illustrated in FIG. 4.

In FIG. 4, a film formation chamber 301 is a vacuum chamber. In the film formation chamber 301, at least, a plate supporting unit which is a first substrate supporting unit 304, a supporting unit of a substrate on which a material layer 308 is to be formed (formation substrate), which is a second substrate supporting mechanism 305, and a lamp 310 as a heat source are included.

Although not illustrated, the film formation chamber 301 is connected to a first transfer chamber to transfer the formation substrate while keeping vertical placement thereof and to a second transfer chamber to which a plate is transferred while keeping vertical placement thereof. It is to be noted that, in this specification, vertical placement of a substrate refers to placement of a substrate so that a substrate surface makes a certain angle (70° to 100°) nearly perpendicular with respect to a horizontal surface. Because a large-area glass substrate is easy to bend, it is desirably placed vertically to be transferred.

The lamp 310 is more suitable than a heater as the heat source for heating a large-area glass substrate.

As the procedure of film formation, first, in the other film formation chamber, a material layer 308 is formed on one surface of the plate that is a first substrate 307.

Subsequently, the first substrate 307 is transferred from the other film formation chamber to the film formation chamber 301 to be set on the plate supporting mechanism. The second substrate 309 is fixed to the substrate supporting mechanism so that a surface of the first substrate 307, on which the material layer 308 is formed, faces a surface of the second substrate 309, on which the material layer 308 is to be formed (formation surface).

Subsequently, light is emitted from the lamp 310 to rapidly heat the plate while retaining the distance d as illustrated in FIG. 4. When the plate is rapidly heated, the material layer 308 on the plate is heated in a short time by indirect heat conduction to be evaporated, and then an evaporation material is formed on the formation surface of the second substrate 309 that is disposed to face the material layer 308. Film thickness uniformity of the film formation on a flat surface of the second substrate 309 can be set to less than 3%. Furthermore, it is possible to realize the compact film formation apparatus of which the capacity is extremely small in comparison with a conventional evaporation apparatus having a large-capacity chamber.

A plurality of film formation apparatuses described in this embodiment mode can be disposed in series to form an in-line manufacturing apparatus. It is needless to say that a film formation apparatuses of other film formation methods can be combined therewith.

The film formation apparatuses described in this embodiment mode has the same structure as that of Embodiment Mode 1 except for employing vertical placement of a substrate; accordingly, this embodiment mode can be freely combined with Embodiment Mode 1.

Embodiment Mode 4

In this embodiment mode, explanation will be made with reference to perspective views illustrated in FIGS. 5A and 5B.

Figure 5A:
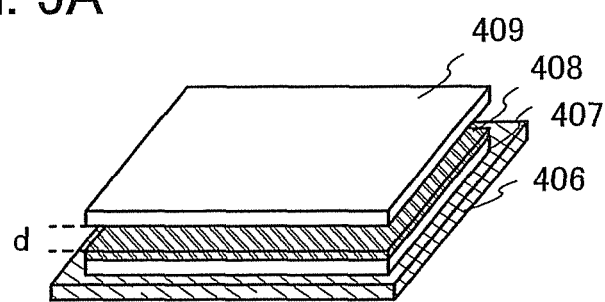
FIGS. 5A and 5B are perspective views illustrating a film formation process.

FIG. 5A is a perspective view illustrating part of the face-down film formation apparatus as illustrated in FIG. 1C. FIG. 5A illustrates that a first material layer 408 is formed on a first substrate 407 just before film formation and immediately after a flat board heat source 406 having a larger area than the first substrate 407 becomes in contact with the first substrate 407. In addition, a second substrate 409 disposed to face downward to overlap the first substrate 407 with a distance d therebetween is illustrated.

Figure 5B:
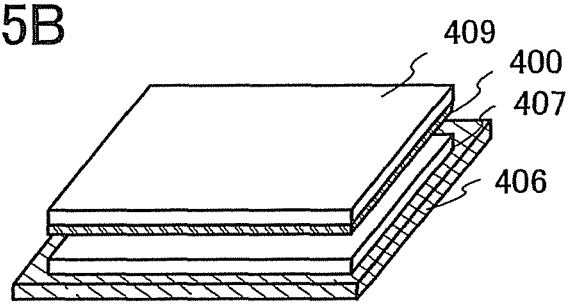

In addition, FIG. 5B illustrates that a second material layer 400 is formed, immediately after the film formation, on the lower surface of the second substrate 409 by evaporation of the first material layer 408. By using the film formation apparatus described in Embodiment Mode 1, a film having the same area as the first substrate 407 can be formed on the second substrate 409 in a short time in this manner.

Although FIGS. 5A and 5B illustrate examples in which the film having the same area as the substrate is formed, selective film formation is possible using the film formation apparatus described in Embodiment Mode 1.

Figure 6A:
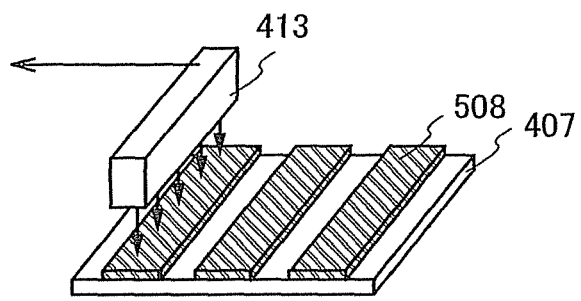
FIGS. 6A to 6C are perspective views illustrating a film formation process.
Figure 6B:
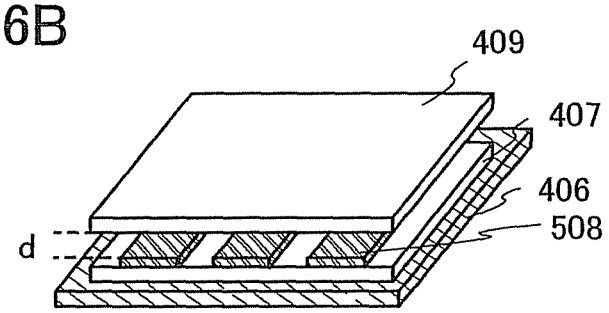
Figure 6C:
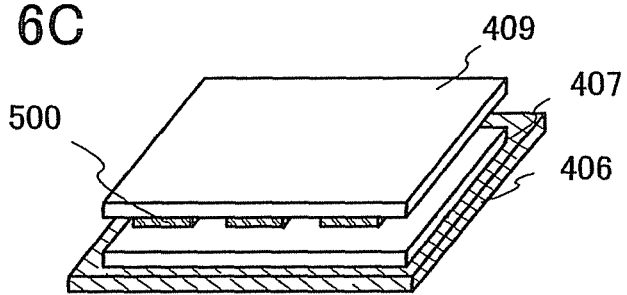

FIGS. 6A to 6C each illustrate a method of selective film formation. FIG. 6A illustrates that a first material layer 508 is selectively formed on the first substrate 407 by ink jetting before introduction into the film formation chamber of Embodiment Mode 1. FIG. 6A illustrates that a linear pattern is formed by a head 413 of an ink-jet printer on the first material layer 508.

FIG. 6B illustrates that the first substrate 407 on which the first material layer 508 is formed is disposed on the flat board heat source 406 just before the film formation. FIG. 6B also illustrates that the second substrate 409 is disposed to face downward to overlap the first substrate 407 with a distance d therebetween.

FIG. 6C illustrates that the second material layer 500 is formed, just after the film formation, on the lower surface of the second substrate 409 by evaporation of the first material layer 508. By using the film formation apparatus described in Embodiment Mode 1, a desired pattern can be formed on the second substrate 409 in a short time in this manner without using an evaporation mask.

FIGS. 7A to 7D are perspective views each illustrating that a pattern of a material layer is selectively formed with the use of a pattern of a thermal conductive layer that is selectively formed.

Figure 7A:
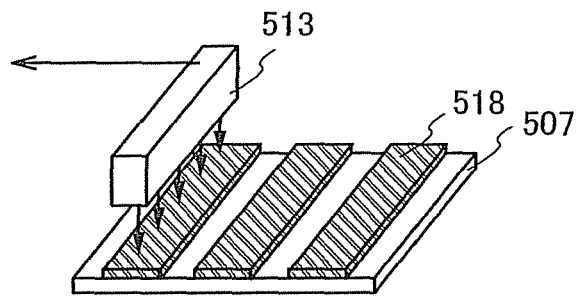
FIGS. 7A to 7D are perspective views illustrating a film formation process.

FIG. 7A illustrates that a thermal conductive layer 518 is selectively formed on a first substrate 507 by ink jetting before introduction into the film formation chamber of Embodiment Mode 1.

Figure 7B:
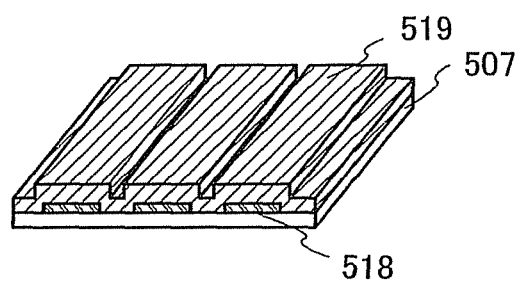

FIG. 7B illustrates that a first material layer 519 is formed to cover the thermal conductive layer 518.

Figure 7C:
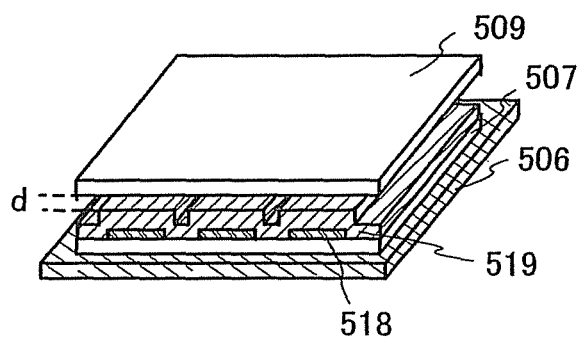

FIG. 7C illustrates that the first substrate 507 on which the first material layer. 519 is formed is disposed on the flat board heat source 506 just before the film formation. FIG. 7C also illustrates that the second substrate 509 is disposed to face downward to overlap the first substrate 507 with a distance d therebetween.

Figure 7D:
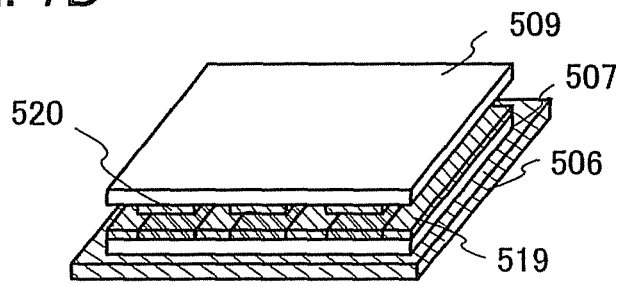

FIG. 7D illustrates that a second material layer 520 is formed, immediately after the film formation, on the lower surface of the second substrate 509 in such a manner that the thermal conductive layer 518 is instantly heated and the first material layer 519 is partially evaporated. The first material layer 519 partially remains on the first substrate 507 after the film formation. By using the film formation apparatus described in Embodiment Mode 1, a desired pattern can be formed on the second substrate 509 in a short time without using an evaporation mask.

This embodiment mode can be applied not only to Embodiment Mode 1 but also to Embodiment Mode 2 or 3.

In Embodiments described below, the present invention formed of the above-mentioned structures will be further described in detail.

Embodiment 1

Figure 8:
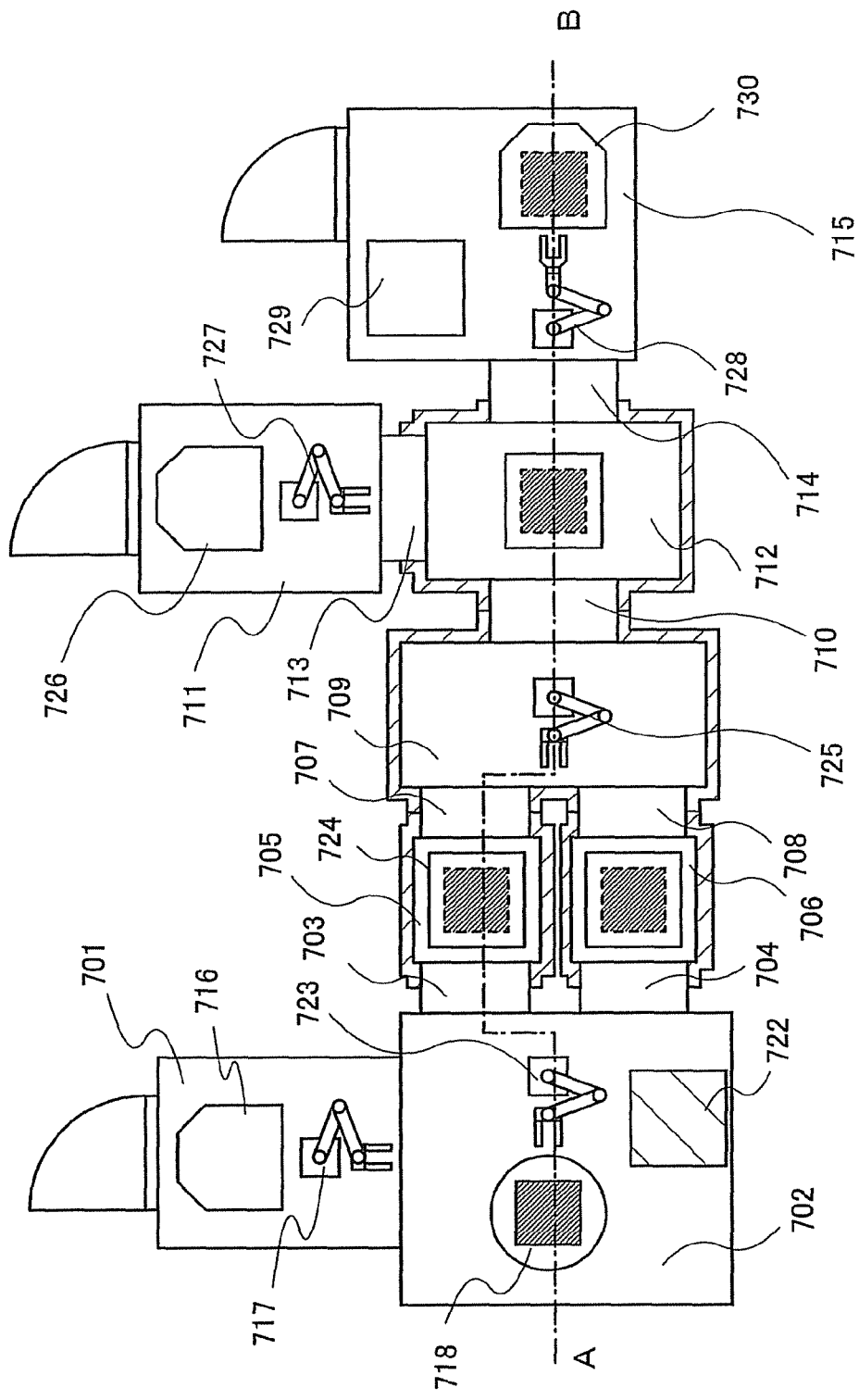
FIG. 8 is a top view illustrating a manufacturing apparatus.
Figure 9:
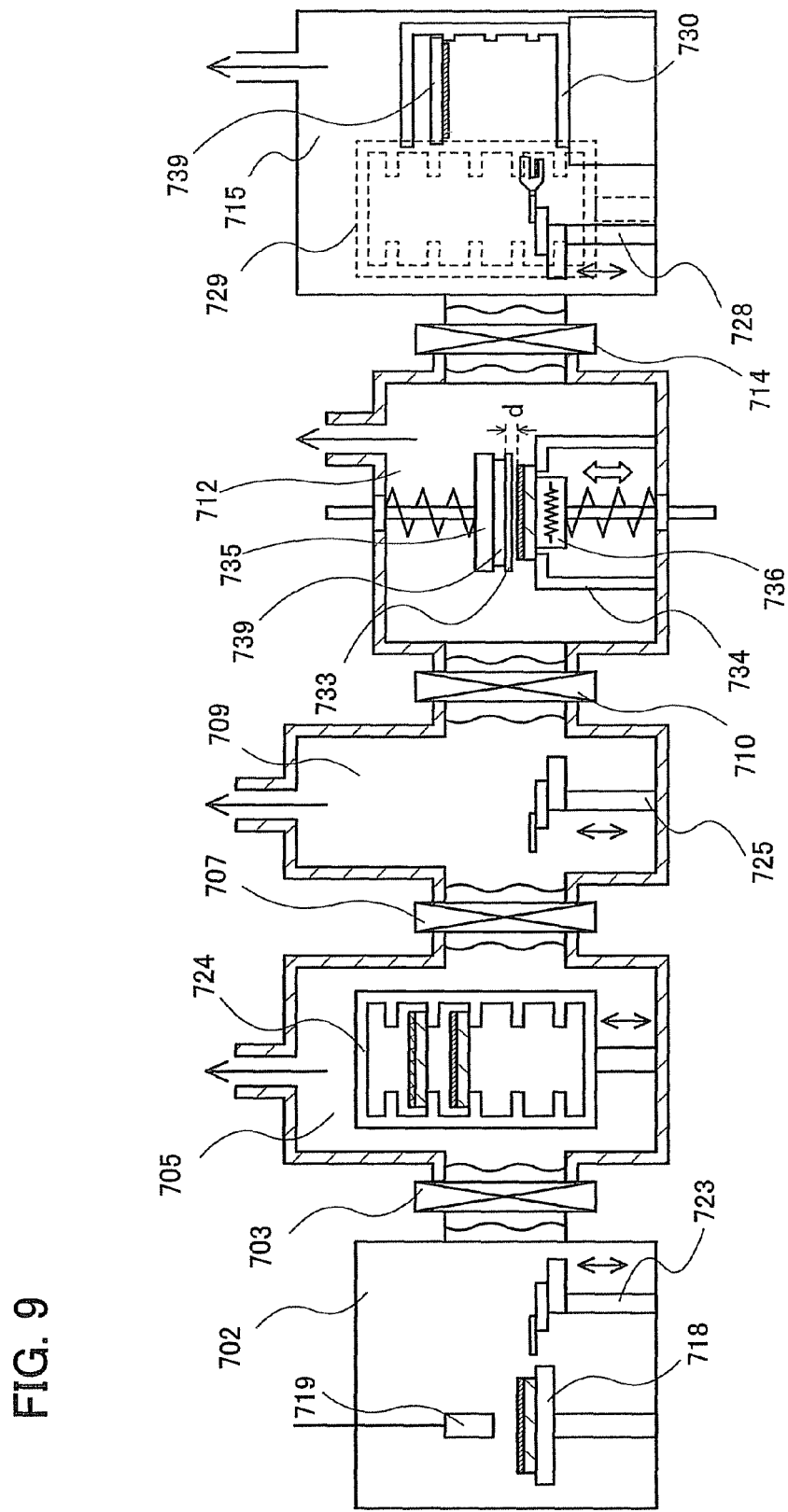
FIG. 9 is a cross-sectional view illustrating a manufacturing apparatus.

FIG. 8 and FIG. 9 illustrate an example of an automated multi-chamber manufacturing apparatus.

FIG. 8 is a top plan view of the multi-chamber manufacturing apparatus. FIG. 9 corresponds to a cross section taken along a dashed line A-B.

First, an arrangement in the manufacturing apparatus is described with reference to FIG. 8. A first load chamber 701 in which a first substrate 720 (also referred to as a plate) is set is connected to a first film formation chamber 702. The first film formation chamber 702 is connected to a first stock chamber 705 through a first gate valve 703, and to a second stock chamber 706 through a second gate valve 704. The first stock chamber 705 is connected to a transfer chamber 709 through a third gate valve 707. The second stock chamber 706 is connected to the transfer chamber 709 through a fourth gate valve 708.

In the first film formation chamber 702, it is possible to form an environment such as an atmosphere in which the number of ozone is controlled as needed or a nitrogen atmosphere in which the oxygen density and the dew point are controlled. Further, a hot plate or an oven is included for drying or the like after coating. The first film formation chamber 702 desirably has a function of surface cleaning or of improvement in wettability with a UV lamp or the like if needed. The first film formation chamber 702 is a film formation apparatus for film formation on the plate in the atmospheric pressure environment, and the first stock chamber 705 is a chamber to store the plate formed in the atmospheric pressure environment as well as to deliver it to a second film formation chamber 712 that is evacuated to a vacuum. In such a structure, evacuation is necessary each time after process of the predetermined number of plates. In other words, time taken for vent and exhaust of the first stock chamber 705 directly affects throughput of the manufacturing apparatus. Accordingly, as illustrated in FIG. 8, two transfer courses are provided. The two transfer courses enable efficient processes of a plurality of substrates to reduce process time per substrate. For example, while the first stock chamber 705 is vented and exhausted, the second stock chamber 706 can store the plate formed in the first film formation chamber 702. Moreover, the present invention is not limited to the two transfer courses and three or more transfer courses may be provided.

The transfer chamber 709 is connected to the second film formation chamber 712 through a fifth gate valve 710. A second load chamber 711 in which a second substrate 729 is set is connected to the second film formation chamber 712 through a fifth gate valve 713. The second film formation chamber 712 is connected to an unload chamber 715 through a sixth gate valve 714.

Hereinafter, a procedure will be described in which the plate that is the first substrate 720 is transferred into the manufacturing apparatus, and the second substrate 739 provided with a thin film transistor, an anode (first electrode), and an insulator to cover an end of the anode is transferred beforehand into the manufacturing apparatus illustrated in FIG. 8 to manufacture a light-emitting device.

First, the plate that is the first substrate 720 is set in the first load chamber 701. A cassette 716 storing a plurality of plates is made to be provided.

Subsequently, the plate is transferred onto a stage 718 in the first film formation chamber 702 by a transfer robot 717. In the first film formation chamber 702, a material layer 721 is formed on the plate by a coating apparatus using spin coating. It is to be noted that the present invention is not limited to the coating apparatus using spin coating and a coating apparatus using spraying, ink jetting, or the like can be used. Furthermore, the plate surface is subjected to UV treatment if necessary. If baking is needed, a hot plate 722 is used. FIG. 9 illustrates a state in the first film formation chamber 702 as a cross section in which a material solution is dropped from a nozzle 719 and the material layer 721 is formed on the plate 720 that is disposed on the stage 718. Here, a material solution obtained by dispersing a light-emitting organic material in a high polymer material is dropped and baked to form the material layer 721.

Subsequently, the plate is transferred to the first stock chamber 705 by a transfer robot 723 with the second gate valve 703 opened. After the transfer, the pressure in the first stock chamber 705 is reduced. As illustrated in FIG. 9, a structure is desirable in which a plurality of plates can be stored in the first stock chamber 705, here, in particular, a plate stock holder 724 capable of vertical movement. Moreover, a mechanism may be provided in which plate can be heated in the first stock chamber 705. The first stock chamber 705 is connected to a vacuum evacuation treatment chamber. After the evacuation, an inert gas is desirably introduced to the first stock chamber 705 to obtain the atmospheric pressure.

Next, after the pressure in the first stock chamber 705 is reduced, the plate is transferred to the transfer chamber 709 with the third gate valve 707 opened and then transferred to the second film formation chamber 712 with the fifth gate valve 710 opened. The transfer chamber 709 is connected to the vacuum evacuation treatment chamber, and evacuation in advance to maintain a vacuum is desirable so that moisture or oxygen does not enter the transfer chamber 709 as much as possible. The plate is transferred by a transfer robot 725 provided in the transfer chamber 709.

Through the procedure so far, the plate on which the material layer 721 is formed is set in the second film formation chamber 712. Then, the procedure is described in which the second substrate 739 that is in advance provided with the thin film transistor, the anode (first electrode), and the insulator that covers an end of the anode is set in the film formation chamber 712 at the same time. First, the cassette 726 storing a plurality of second substrates 739 is set in the second load chamber 711. The second load chamber 711 is connected to the vacuum evacuation treatment chamber; after the evacuation, the second substrate 739 is transferred to the second film formation chamber 712 by a transfer robot 727 with the fifth gate valve 713 opened.

Through the above procedure, the plate 720 and the second substrate 739 are set in the second film formation chamber 712. The second film formation chamber 712 corresponds to the film formation apparatus described in Embodiment Mode 1.

In the film formation chamber 712, at least, a plate supporting base 734 which is a first substrate supporting unit, a second substrate supporting base 735 which is a second substrate supporting unit, and a heater capable of vertical movement as a heat source 736 are included. In addition, a mask 733 for selective film formation is disposed to overlap the second substrate 739. The mask 733 and the second substrate 739 are desirably aligned in advance.

The surface on which the material layer 721 is formed of the plate 720 is fixed on the substrate supporting mechanism to face a surface of the second substrate 739, on which the material layer 721 is to be formed (formation substrate). Next, the substrate supporting mechanism is moved until a distance between the material layer 721 and the second substrate 739 is reduced to be a distance d. The distance d is set to less than or equal to 100 mm, preferably less than or equal to 5 mm. It is to be noted, because the second substrate 739 is a glass substrate, a lower limit of the distance d is 0.5 mm in consideration of bend thereof. Further, in a case where an electrostatic chuck is used to prevent the substrate from wrapping and bending, the lower limit of the distance d can be set to 0.01 mm even if either a glass substrate or a quartz substrate is used. Because the mask 733 is interposed in this embodiment, the distance d is set to 5 mm. This distance d is determined so that the mask 733 and the second substrate 739 are at least not in contact with each other. The shorter the distance d is, the more expansion of evaporation can be suppressed to prevent evaporation involving an unwanted material entering through a mask.

Subsequently, as illustrated in FIG. 9, the heat source 736 is approached to the plate 720 while retaining the distance d. A heater capable of vertical movement under the plate is used as the heat source 736. Although the heater is basically set to become constant at a predetermined temperature, the temperature may be controlled so that the temperature is raised or lowered in the range in which the takt time is not affected.

When the heat source 736 is approached to the plate 720, the material layer 721 on the plate is heated in a short time by direct heat conduction to be evaporated, and then an evaporation material is formed on the formation surface (i.e., lower flat surface) of the second substrate 739 that is disposed to face the material layer 721. In addition, film thickness uniformity of the film formation on the lower flat surface of the second substrate 739 can be set to less than 3%.

Accordingly, a light-emitting layer can be formed on the anode (first electrode) on the second substrate 739. Before the light-emitting layer is formed, a hole injecting layer or a hole transporting layer may be similarly formed in the second film formation chamber 712 to be stacked. After the light-emitting layer is formed, an electron transporting layer or an electron injecting layer may be similarly formed in the second film formation chamber 712 to be stacked. Furthermore, after the light-emitting layer is formed, a cathode (second electrode) is similarly formed through film formation in the second film formation chamber 712 to be stacked. Through the above-mentioned process, a light-emitting element including, at least, the thin film transistor, the anode (first electrode), and the cathode (second electrode) can be manufactured on the second substrate 739.

For efficient manufacture of the light-emitting device, plates on which a plurality of different material layers are formed may be stored in the plate stock holder 724, and the plate may be sequentially exchanged to be stacked with the second substrate 739 set on the second substrate supporting base 735. For example, the following plates may be prepared so that the plate to be set in the second film formation chamber 712 is sequentially exchanged to be stacked: a first plate on which a material layer to serve as a hole injecting layer is formed, a second plate on which a material layer to serve as a hole transporting layer is formed, a third plate on which a material layer to serve as a light-emitting layer is formed, a fourth plate on which a material layer to serve as an electron transporting layer is formed, a fifth plate on which a material layer to serve as an electron injecting layer is formed, and a sixth plate on which an aluminum layer to serve as the cathode is formed. Even if different material layers are formed in the same film formation chamber in this manner, expansion of the evaporation can be suppressed because of the short distance d to prevent mixture of the materials of the material layers.

In addition, for manufacture of a full color light-emitting device, the following plates may be prepared so that the plate to be set in the second film formation chamber 712 is sequentially exchanged to be stacked: a first plate on which a red light-emitting layer is formed, a second plate on which a blue light-emitting layer is formed, and a third plate on which a green light-emitting layer is formed. It is to be noted that the mask 733 need to be exchanged. Even if different light-emitting layers are formed in the same film formation chamber in this manner, expansion of the evaporation can be suppressed because of the short distance d to prevent mixture of the materials of the light-emitting layers, and accordingly color purities of each light-emitting element can be obtained.

After film formation on the second substrate 739 was completed, the second substrate 739 is transferred to the unload chamber 715 with the sixth gate valve 714 opened. The unload chamber 715 is also connected to the vacuum evacuation treatment chamber. In the unload chamber 715, the pressure is reduced by the time the second substrate 739 is transferred. The second substrate 739 is stored in a cassette 730 by using a transfer robot 728. It is to be noted that the second substrate 739 is set in the cassette 730 so that the formation surface faces downward to prevent adhesion of impurities such as dust. As long as the plate 720 has the same size and thickness as the second substrate 739, the plate 720 can also be stored in the cassette 730 by using the transfer robot 728. Further, a mask stock holder 729 may be provided in the unload chamber 715. For separately coloring light-emitting layers, or the like, a mask is desirably prepared for each light-emitting color. The mask stock holder 729 can store a plurality of masks that are needed.

A sealing chamber to seal the light-emitting element may be connected to the unload chamber 715. The sealing chamber is connected to a load chamber to transfer a sealing can or a sealing substrate. The second substrate 739 and the sealing substrate are attached to each other in the sealing chamber. At that time, a substrate reversal mechanism is desirably provided in the transfer robot 728 if the second substrate 739 is desirably reversed.

A magnetic levitation turbo molecular pump, a cryopump, or a dry pump is provided in the vacuum evacuation treatment chamber. Accordingly, the ultimate vacuum of the transfer chamber connected to a feed chamber can be set to $10^{-5}$ to $10^{-6}$ Pa, and reverse diffusion of impurities from the pump side and the exhaust system can be further suppressed. An inert gas such as nitrogen or a rare gas is used as a gas to be introduced in order to prevent the impurities from being introduced into the apparatus. A gas that is highly purified by a gas refiner before the introduction into the apparatus is used as the gas to be introduced into the apparatus. Thus, the gas refiner needs to be provided so that the gas is introduced into the evaporation apparatus after it is highly purified. Accordingly, oxygen, moisture, or other impurities in the gas can be removed beforehand to prevent these impurities from being introduced into the apparatus.

Although the transfer robot is given as an example of a transfer unit for the plate or the substrate, the transfer unit is not limited in particular and a roller or the like may be used. In addition, the position where the transfer robot is provided is not particularly limited to the arrangements in FIG. 8 and FIG. 9 and may be set to a desired position.

Although the film formation apparatus using spin coating is described as an example in this embodiment, alternatively, a droplet discharge apparatus using ink jetting may be provided in a film formation chamber.

Figure 10:
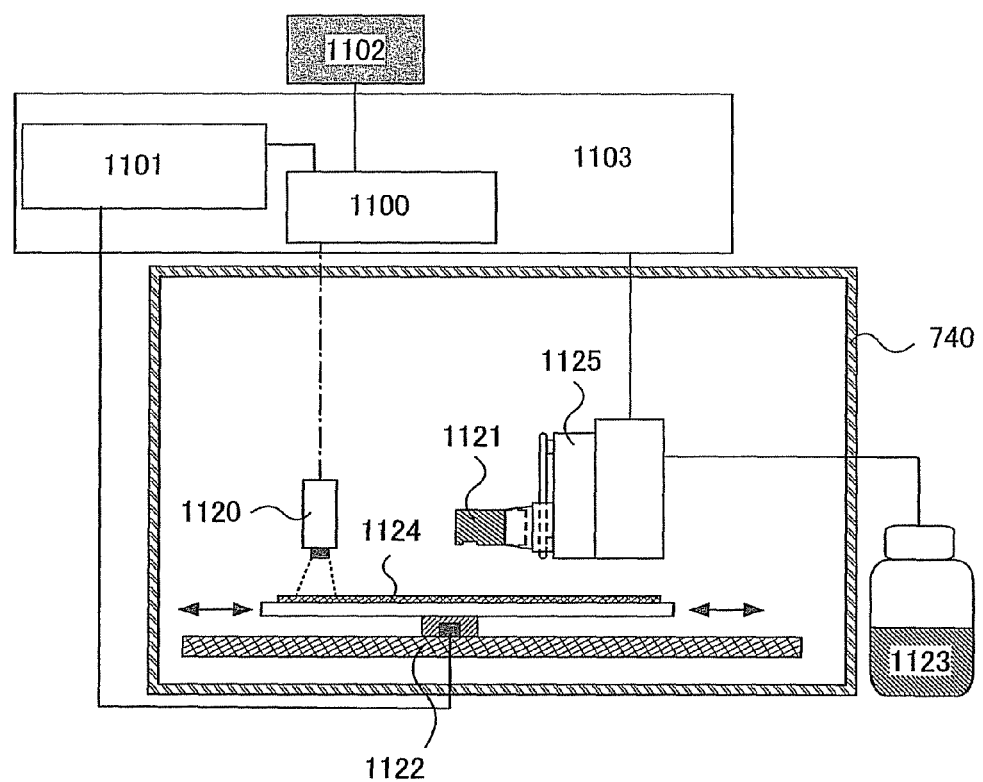
FIG. 10 is a cross-sectional view illustrating a film formation chamber.

An outline of the droplet discharge apparatus is roughly described with reference to FIG. 10. As required components of this apparatus include a droplet discharge unit 1125 provided with a head 1121 with a plurality of nozzles arranged in an axial direction, a control portion 1103 to control the droplet discharge unit 1125, a stage 1122 that fixes a substrate 1124 and moves in X, Y, and θ directions, and the like. This stage 1122 also has a function to fix the substrate 1124 by a technique such as vacuum chuck. A composition is discharged to the substrate 1124 from a discharging outlet of each nozzle included in the droplet discharge unit 1125 to form a pattern.

The control portion 1103 controls the stage 1122 and the droplet discharge unit 1125. The control portion 1103 includes a stage alignment portion 1101. The control portion 1103 also controls an imaging unit 1120 such as a CCD camera. The imaging unit 1120 detects the position of a marker, and supplies the detected information to the control portion 1103. The detected information can also be displayed on a monitor 1102. In addition, the control portion 1103 includes an alignment control portion 1100. The composition is supplied from an ink bottle 1123 to the droplet discharge unit 1125.

In forming a pattern, the droplet discharge unit 1125 may be moved, or the stage 1122 may be moved with the droplet discharge unit 1125 fixed. For moving the droplet discharge unit 1125, however, acceleration of the composition, a distance between the nozzles provided with the droplet discharge unit 1125 and an object to be processed, and the environment need to be considered.

In addition, although not illustrated, a movement mechanism in which the head 1121 moves vertically, a control unit thereof, and the like may be provided as accompanying components in order to improve the accuracy of the reaching. Then, the distance between the head 1121 and the substrate 1124 can be changed depending on the properties of the composition to be discharged. Furthermore, a gas supply unit and a shower head may be provided. If they are provided, the atmosphere can be substituted for an atmosphere of the same gas as a solvent of the composition to prevent desiccation to some extent. Moreover, a clean unit or the like to supply clean air and to reduce dust in a work area may be provided. Further, although not illustrated, a unit to measure various values of physical properties such as temperature, and pressure may be provided as well as a unit to heat a substrate, as necessary. These units can be collectively controlled by the control unit provided outside of a chassis. Furthermore, if the control unit is connected to a manufacturing management system through an LAN cable, a wireless LAN, an optical fiber, or the like, the process can be uniformly managed from the outside to lead to improvement in productivity. It is to be noted that evacuation for the operation under reduced pressure may be performed in order to hasten drying of the composition that reaches the object and to remove solvent components of the composition.

In the manufacturing apparatus of this embodiment, scattering of a material in a vacuum chamber can be suppressed with a distance between the substrate on which the material layer 721 is to be formed and the plate of less than or equal to 100 mm, preferably less than or equal to 5 mm. Thus, the interval of maintenance such as cleaning in the film formation chamber and the like can be lengthened. Furthermore, in the manufacturing apparatus of this embodiment, the first film formation chamber 702 and the second film formation chamber 712 are a face-up film formation apparatus and a face-down system, respectively; accordingly, smooth film formation process can be achieved without reversing the plate and the formation substrate in the middle of the transfer thereof.

In a multi-chamber manufacturing apparatus, effect of the present invention can be sufficiently obtained with at least one film formation chamber 712. Therefore, a film formation chamber using a known film formation method such as evaporation may be provided to be connected to the second film formation chamber 712.

It is to be noted that the manufacturing apparatus described in this embodiment can be freely combined with the apparatuses each described in Embodiment Modes 1 to 3.

For example, in a case of employing the face-up film formation apparatus described in Embodiment Mode 2 as the second film formation chamber 712, a mechanism to invert the top and bottom of the plate in the middle of the transfer from the first film formation chamber 702 to the second film formation chamber 712 is provided. At this time, smooth film formation can be realized by employing a face-down film formation apparatus using evaporation as the first film formation chamber 702.

Instead, in a case of using the film formation apparatus employing vertical placement of a substrate described in Embodiment Mode 3 for the second film formation chamber 712, a mechanism to dispose a surface of the plate perpendicular to the horizontal surface in the middle of transferring the plate from the first film formation chamber 702 to the second film formation chamber 712 is provided. In addition, a mechanism to dispose the formation substrate perpendicular to the horizontal surface in the middle of transferring the formation substrate from the second load chamber 711 to the second film formation chamber 712 is provided.

Embodiment 2

Here, an example will be described in which a passive matrix light-emitting device is formed on a glass substrate with reference to FIGS. 11A to 11C, FIG. 12, and FIG. 13.

In a passive (simple-matrix) light-emitting device, a plurality of anodes arranged in stripes (strip-form) are provided perpendicularly to a plurality of cathodes arranged in stripes. A light-emitting layer or a fluorescent layer is interposed at each intersection. Therefore, a pixel at an intersection of an anode selected (to which a voltage is applied) and a cathode selected emits light.

Figure 11A:
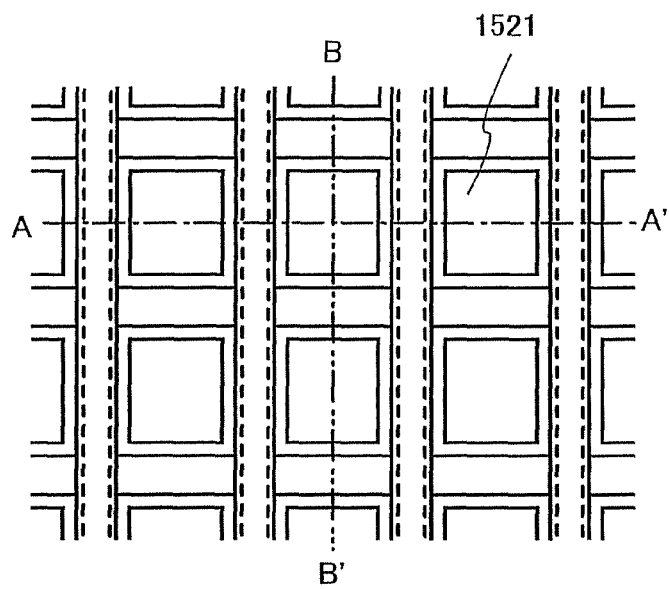
FIG. 11A is a top view of a passive matrix light-emitting device.
Figure 11C:
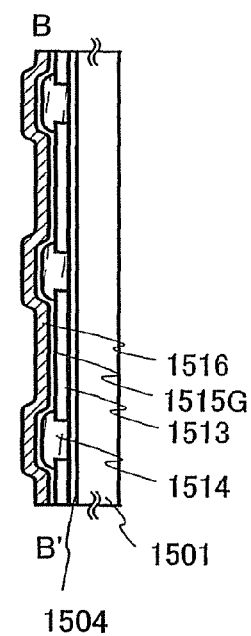
FIGS. 11B and 11C are cross-sectional views of a passive matrix light-emitting device.
Figure 11B:
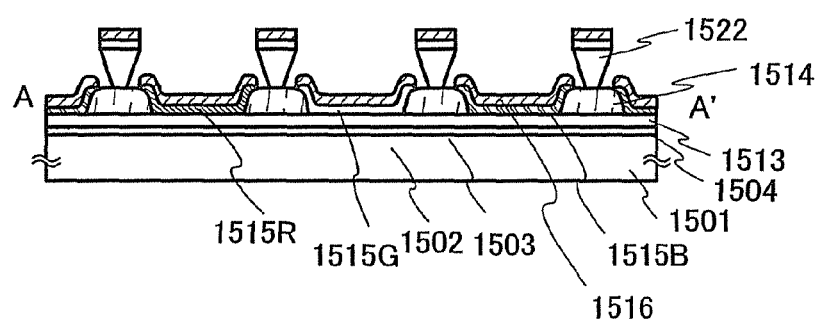

FIG. 11A is a top view of a pixel portion before sealing. FIG. 11B is a cross-sectional view taken along a dashed line A-A' in FIG. 11A. FIG. 11C is a cross-sectional view taken along a dashed line B-B'.

An insulating film 1504 is formed on a first substrate 1501 as a base film. It is to be noted that the base film need not be formed if not necessary. A plurality of first electrodes 1513 are arranged in stripes at regular intervals on the insulating film 1504. A partition wall 1514 having openings each corresponding to a pixel is provided over the first electrodes

1513. The partition wall 1514 having openings is formed using an insulating material (a photosensitive or nonphotosensitive organic material (polyimide, acrylic, polyamide, polyimide amide, resist, or benzocyclobutene) or an SOG film (such as an $SiO_x$ film containing an alkyl group)). It is to be noted that openings each corresponding to the pixel becomes light-emitting regions 1521.

A plurality of inversely tapered partition walls 1522 which are parallel to each other and intersect with the first electrodes 1513 are provided on the partition wall 1514 having openings. The inversely tapered partition walls 1522 are formed by photolithography using a positive-type photosensitive resin of which a portion unexposed to light remains as a pattern, and by adjusting the amount of light exposure or the length of development time so that a lower portion of a pattern is etched more.

Figure 12:
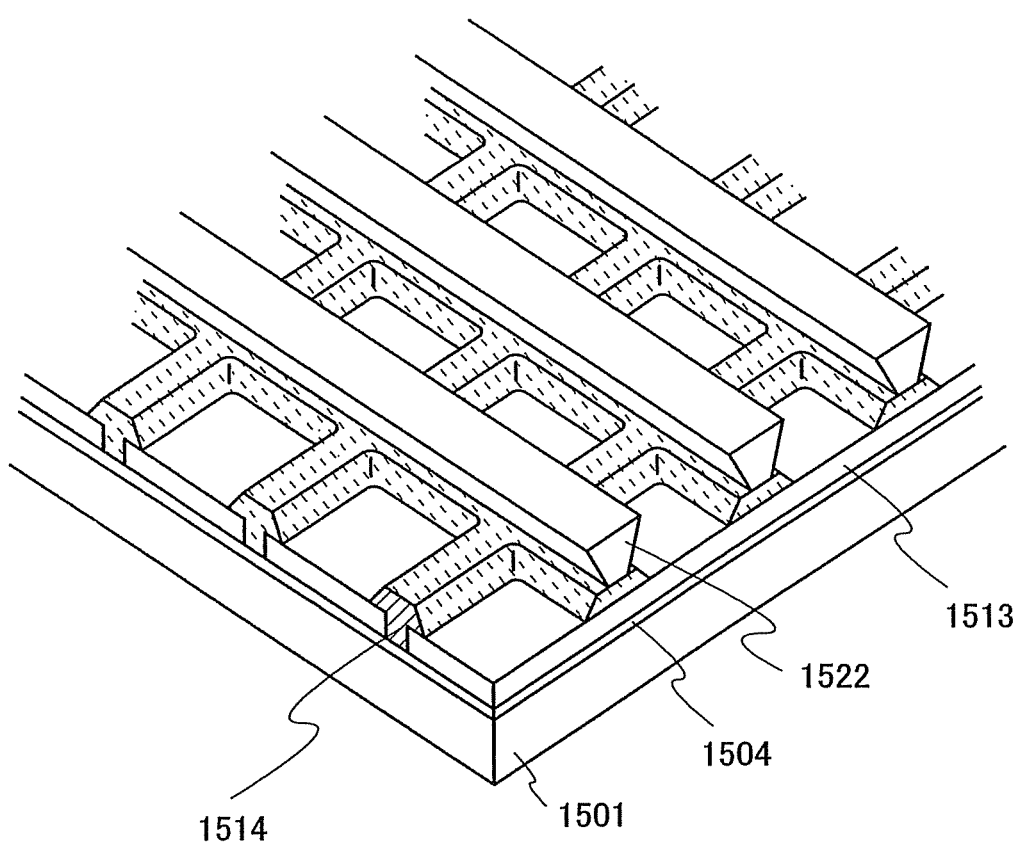
FIG. 12 is a perspective view of a passive matrix light-emitting device.

FIG. 12 is a perspective view immediately after formation of the plurality of inversely tapered partition walls 1522 which are parallel to each other. It is to be noted that the same reference numerals are used to denote the same portions as those in FIGS. 11A to 11C.

The thickness of each of the inversely tapered partition walls 1522 is set to be larger than the total thickness of a stacked film including a light-emitting layer, and a conductive film. When a conductive film and a stacked film including a light-emitting layer are stacked on the first substrate 1501 having the structure illustrated in FIG. 12, they are separated into a plurality of regions that are electrically isolated from each other, so that stacked films 1515R, 15156, and 1515B each including a light-emitting layer, and second electrodes 1516 are formed as illustrated in FIGS. 11A to 11C. The second electrodes 1516 are electrodes in stripe form that are parallel to each other and extend along a direction intersecting with the first electrodes 1513. It is to be noted that the stacked films each including a light-emitting layer and the conductive films are also formed on the inversely tapered partition walls 1522; however, they are separated from the stacked films 1515R, 15156, and 1515B each including a light-emitting layer and the second electrodes 1516.

This embodiment mode describes an example in which the stacked films 1515R, 1515G, and 1515B each including a light-emitting layer are selectively formed to form a light-emitting device capable of performing full color display, from which three kinds of light emission (R, G, and B) can be obtained. The stacked films 1515R, 1515G, and 1515B each including a light-emitting layer are formed into a pattern of stripes parallel to each other.

In this embodiment, stacked films each including a light-emitting layer are sequentially formed by using the second film formation chamber 712 described in Embodiment 1. A first plate including a light-emitting layer from which red light is obtained, a second plate including a light-emitting layer from which green light is obtained, and a third plate including a light-emitting layer from which blue light is obtained are each prepared to be transferred to the second film formation chamber 712 described in Embodiment 1. Then, a substrate provided with the first electrode 1513 is also transferred to the second film formation chamber 712. Then, a surface of the first plate is heated by a heat source capable of heating a surface with the same area as the substrate or a surface with a larger area than the substrate to be subjected to evaporation. Subsequently, the second plate and the third plate are selectively subjected to evaporation as appropriate. The second film formation chamber 712 described in Embodiment 1 can prevent evaporation involving an unwanted material entering through a mask, and therefore inversely tapered partition walls 1522 is not necessarily needed. Moreover, in the second film formation chamber 712, excellent film thickness uniformity that is less than 3% is realized, and therefore a light-emitting layer with desired film thickness can be obtained and uneven coloring of the light-emitting device can be reduced. Thus, the second film formation chamber 712 described in Embodiment 1 is useful as a manufacturing apparatus of a passive matrix light-emitting device.

Alternatively, stacked films each including a light-emitting layer which emits light of the same color may be formed over the entire surface to provide monochromatic light-emitting elements, so that a light-emitting device capable of performing monochromatic display or a light-emitting device capable of performing area color display may be provided. Still alternatively, a light-emitting device capable of performing full color display may be provided by combining a light-emitting device which provides white light emission with color filters.

Further, sealing is performed using a sealant such as a sealant can or a glass substrate for sealing, if necessary. Here, a glass substrate is used as the second substrate, and the first substrate 1501 and the second substrate are attached to each other using an adhesive material such as a sealing material to seal a space surrounded by the adhesive material such as the sealing material. The space that is sealed is filled with a filler or a dried inert gas. Moreover, a space between the first substrate 1501 and the filler may be filled and sealed with a desiccant agent in order to improve reliability of the light-emitting device. The desiccant agent removes a minute amount of moisture for sufficient desiccation. For the desiccant agent, a substance that adsorbs moisture by chemical adsorption such as oxide of alkaline earth metal such as calcium oxide or barium oxide can be used. In addition, a substance that adsorbs moisture by physical adsorption such as zeolite or silicagel may be used.

The desiccant agent is not necessarily provided if the sealant that covers and is contact with the light-emitting element is provided to sufficiently block the outside air.

Figure 13:
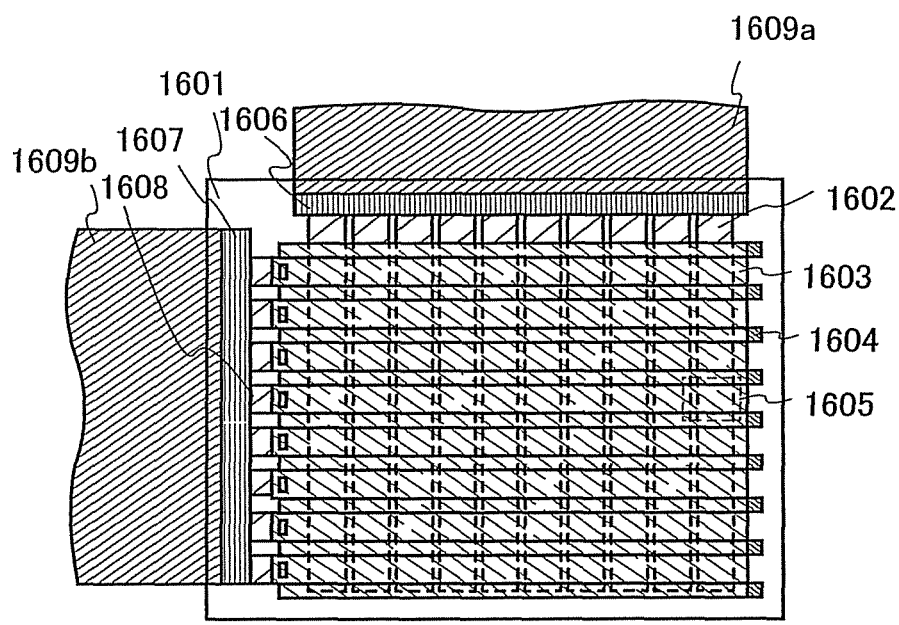
FIG. 13 is a top view of a passive matrix light-emitting device.

Next, FIG. 13 is a top view of a light-emitting module mounted with an FPC or the like.

It is to be noted that the light-emitting device in this specification refers to an image display device, a light-emitting device, or a light source (including a lighting device). Further, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a light-emitting device by a chip on glass (COG) method.

In a pixel portion for displaying images, scanning lines and data lines intersect with each other perpendicularly as illustrated in FIG. 13.

The first electrodes 1513 in FIGS. 11A to 11C correspond to scanning lines 1603 in FIG. 13, the second electrodes 1516 correspond to data lines 1602, and the inversely tapered partition walls 1522 correspond to partition walls 1604. Light-emitting layers are interposed between the data lines 1602 and the scanning lines 1603, and an intersection portion indicated by a region 1605 corresponds to one pixel.

It is to be noted that the scanning lines 1603 are electrically connected at their ends to connection wirings 1608, and the connection wirings 1608 are connected to an FPC 1609b through an input terminal 1607. The data lines 1602 are connected to an FPC 1609a through an input terminal 1606.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an anti-reflection film. For example, anti-glare treatment may be carried out by which reflected light can be diffused by projections and depressions on a surface so as to reduce reflection.

Through the above-described process, a flexible passive-matrix light-emitting device can be manufactured. If inversely tapered partition walls are not needed with the use of the film formation apparatus of the present invention, an element structure can be largely simplified and time for the manufacturing process can be reduced.

Although FIG. 13 illustrates an example in which a driver circuit is not provided over a substrate, an IC chip including a driver circuit may be mounted as described below.

When the IC chip may be mounted, a data line side IC and a scanning line side IC, in each of which the driver circuit for transmitting a signal to a pixel portion is formed, are mounted on the periphery of (outside) the pixel portion by a COG method. The mounting may be performed using a TCP or a wire bonding method other than the COG method. The TCP is a TAB tape mounted with the IC, and the TAB tape is connected to a wiring over an element formation substrate to mount the IC. Each of the data line side IC and the scanning line side IC may be formed using a silicon substrate. Alternatively, it may be formed in such a manner that a driver circuit is formed using a TFT over a glass substrate, a quartz substrate, or a plastic substrate. Although described here is an example in which one IC is provided on one side, a plurality of ICs may be provided on one side.

Embodiment 3

Figure 14A:
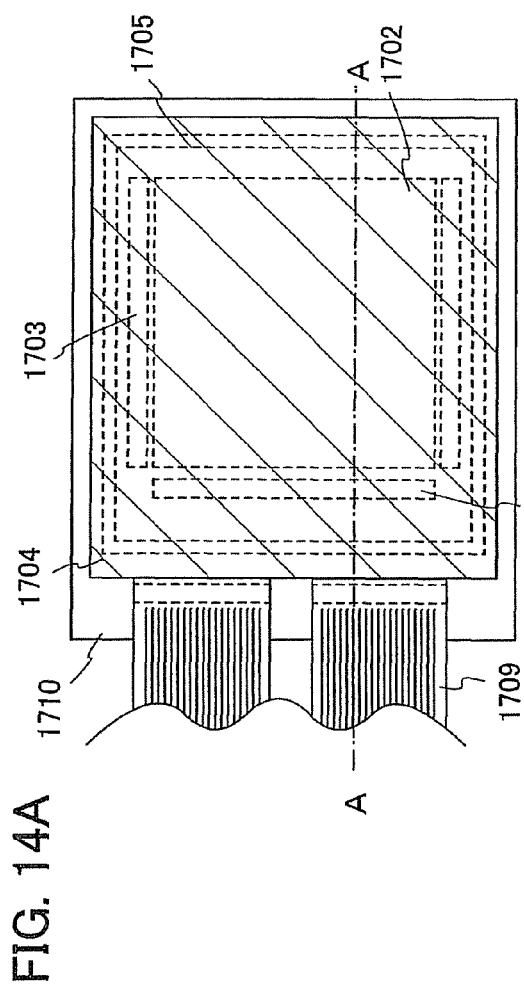
FIGS. 14A and 14B are views illustrating a structure of a light-emitting device.
Figure 14B:
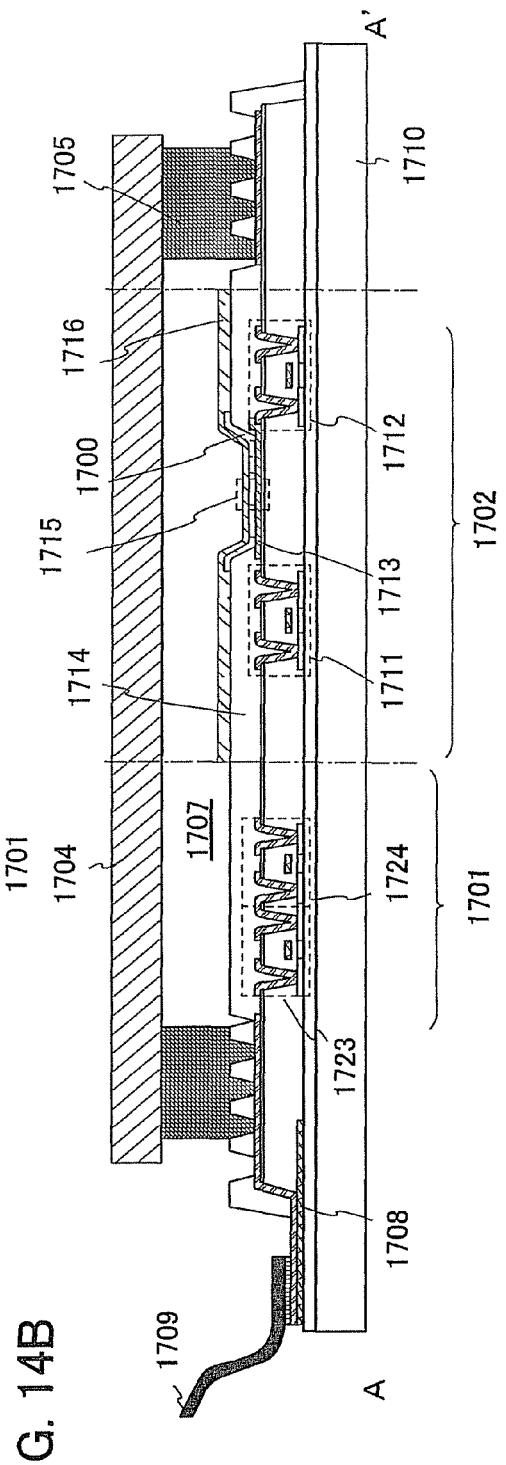

In this embodiment, a light-emitting device of the present invention will be described with reference to FIGS. 14A and 14B. FIG. 14A is a top view illustrating a light-emitting device and FIG. 14B is a cross-sectional view taken along a line A-A'. A reference numeral 1701 indicated by a dotted line denotes a driver circuit portion (source side driver circuit); 1702 denotes a pixel portion; 1703 denotes a driver circuit portion (gate side driver circuit); 1704 denotes a sealing substrate; 1705 denotes a sealant, and 1707 denotes a space surrounded by the sealant 1705.

A reference numeral 1708 denotes a wiring for transmitting a signal inputted to the source side driver circuit 1701 and the gate side driver circuit 1703, and the wiring 1708 receives a video signal, a clock signal, a start signal, a reset signal, and the like from an flexible printed circuit (FPC) 1709 that is to be an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure will be described with reference to FIG. 14B. Although a driver circuit portion and a pixel portion are formed over an element substrate 1710, a pixel portion 1702 and a source side driver circuit 501 that is a driver circuit portion are illustrated here.

As the source side driver circuit 1701, a CMOS circuit in which an n-channel TFT 1723 and a p-channel TFT 1724 are combined is formed. A circuit included in the driver circuit may be a known CMOS circuit, PMOS circuit, or NMOS circuit. In this embodiment, a driver-integrated type in which a driver circuit is formed over a substrate is described; however, it is not necessary to have such a structure, and the driver circuit can be formed not over the substrate but outside the substrate.

The pixel portion 1702 is formed of a plurality of pixels each including a switching TFT 1711, a current control TFT 1712, and an anode 1713 that is electrically connected to a drain of the current control TFT 1712. An insulator 1714 is formed so as to cover an edge portion of the anode 1713. Here, the insulator 1714 is formed using a positive type photosensitive acrylic resin film.

The insulator 1714 is formed so as to have a curved surface having curvature at an upper and lower end portions thereof in order to obtain favorable coverage. For example, when a positive type photosensitive acrylic is used as a material for the insulator 1714, a curved surface having a radius of curvature (0.2 to 3 µm) is desirably formed at the upper end portion of the insulator 1714. For the insulator 1714, either a negative type that becomes insoluble in an etchant by photosensitive light or a positive type that becomes soluble in an etchant by light can be used, and an inorganic compound such as silicon oxide or silicon oxynitride can be used as well as an organic compound.

A light-emitting element 1715 and a cathode 1716 are formed over the anode 1713. Here, as a material used for the anode 1713, a material having a high work function is desirable. For example, the following structures can be given: one-layer film of an indium tin oxide (ITO) film, an indium tin silicon oxide (ITSO) film, an indium zinc oxide (IZO) film, a titanium nitride film, a chromium film, a tungsten film, a Zn film, a Pt film, or the like; a stacked film of a titanium nitride film and a film containing aluminum as its main component; a stacked film having a three-layer structure of a titanium nitride film, a film containing aluminum as its main component, and a titanium nitride film; and the like. Resistance as the wiring is low, a favorable ohmic contact with an ITO film can be formed, and further the anode 1713 can be made to serve as an anode in a case where the anode 1713 is formed of the ITO film and a wiring of the current control TFT 1712 connected to the anode 1713 has a stacked structure of a titanium nitride film and a film containing aluminum as its main component or a stacked structure of a titanium nitride film, a film containing aluminum as its main component, and a titanium nitride film. The anode 1713 may be formed using the same material as a first anode in the light-emitting element 1715. The anode 1713 may be formed in contact with the first anode in the light-emitting element 1715.

The light-emitting element 1715 has a structure in which the anode 1713, a layer 1700 containing an organic compound, and the cathode 1716 are stacked; specifically, a hole injecting layer, a hole transporting layer, a light-emitting layer, an electron transporting layer, an electron injecting layer, and the like are stacked. Any one of the film formation apparatuses of Embodiment Modes 1 to 3 is desirably used for the formation. In this example, the film formation apparatuses described in Embodiment Modes 1 is used for the formation. In the manufacturing apparatus described in Embodiment 1, excellent film thickness uniformity that is less than 3% is realized, and therefore desired film thickness can be obtained to reduce luminance variations in a light-emitting device.

A material (Al, Ag, Li, Ca, or an alloy thereof: MgAg, MgIn, AlLi, CaF2, or calcium nitride) having a low work function may be used as a material for the cathode 1716; however, the material for the cathode 1716 is not limited to the above and can employ various conductive layers by selection of an appropriate electron injecting material. When light emitted from the light-emitting element 1715 is made to be transmitted through the cathode 1716, for the cathode 1716, it is possible to use a stacked layer of a metal thin film with a reduced film thickness and a transparent conductive film of oxide indium tin oxide alloy (ITO), indium tin silicon oxide (ITSO), an indium oxide zinc oxide alloy ($In_2O_3$—ZnO), zinc oxide (ZnO), or the like. The cathode 1716 may be formed using the same material as a second cathode in the light-emitting element 1715. The cathode 1716 may be formed in contact with the second cathode in the light-emitting element 1715.

Further, a structure is obtained in which the light-emitting element 1715 is provided in the space 1717 surrounded by the element substrate 1710, the sealing substrate 1704, and the sealant 1705 by attaching the sealing substrate 1704 to the element substrate 1710 by using the sealant 1705. The space 1707 may be filled not only with an inert gas (e.g., nitrogen or argon) but also with the sealant 1705.

An epoxy-based resin is preferably used for the sealant 1705. A material used for these is desirably a material which does not transmit moisture or oxygen as possible. As a material used for the sealing substrate 1704, a plastic substrate made of fiberglass-reinforced plastics (FRP), polyvinyl fluoride (PVF), myler, polyester, acrylic, or the like can be used besides a glass substrate or a quartz substrate.

As described above, the light-emitting device including the light-emitting element of the present invention can be obtained. Manufacturing cost per substrate tends to increase in a case of an active matrix light-emitting device because of manufacture of a TFT; however, by using a large-area substrate with the manufacturing apparatus described in Embodiment 1, film formation process time per substrate can be largely reduced to realize a huge reduction in the cost for one light-emitting device. Therefore, the manufacturing apparatus described in Embodiment 1 is useful as a manufacturing apparatus for an active matrix light-emitting device.

It is to be noted that the light-emitting device described in this embodiment can be freely combined with the film formation apparatuses each described in Embodiment Modes 1 to 3 or a film formation method described in Embodiment Mode 4. The light-emitting device of this embodiment may include a color conversion film such as a color filter as needed.

Embodiment 4

In this embodiment, with reference to FIGS. 15A to 15E, explanation will be made on various electronic appliances manufactured using a light-emitting device including a light-emitting element manufactured by using the film formation apparatus of the present invention.

Examples of the electronic appliances manufactured using the film formation apparatus of the present invention include: televisions, cameras such as video cameras or digital cameras, goggle displays (head mount displays), navigation systems, audio reproducing devices (e.g., car audio component stereos and audio component stereos), notebook personal computers, game machines, portable information terminals (e.g., mobile computers, mobile phones, portable game machines, and electronic books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic appliances are illustrated in FIGS. 15A to 15E.

Figure 15A:
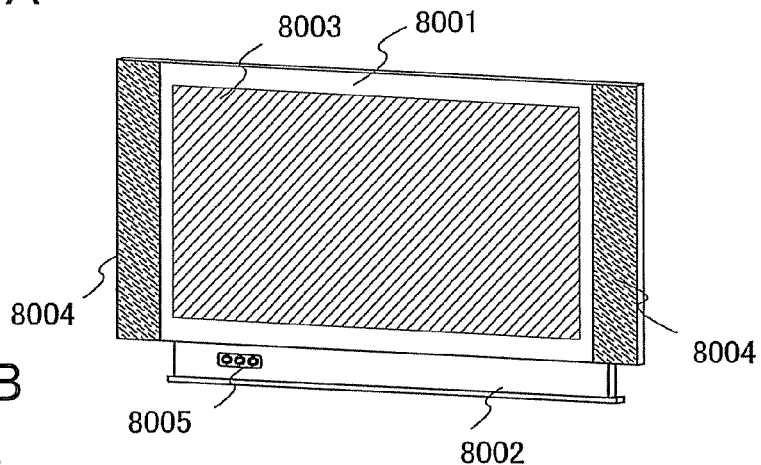
FIGS. 15A to 15E are views illustrating examples of electronic appliances.

FIG. 15A illustrates a display device including a chassis 8001, a supporting base 8002, display portion 8003, a speaker portion 8004, a video input terminal 8005, and the like. The display device is manufactured by using a light-emitting device manufactured using the film formation apparatus of the present invention for the display portion 8003. It is to be noted that the display device includes all devices for displaying information, for example, for a personal computer, for receiving TV broadcasting, and for displaying an advertisement. The film formation apparatus enables a huge reduction in manufacturing cost to provide inexpensive display devices. Furthermore, in the manufacturing apparatus of the present invention, excellent film thickness uniformity that is less than 3% is realized, and therefore desired film thickness can be obtained to reduce display variations in a light-emitting device.

Figure 15B:
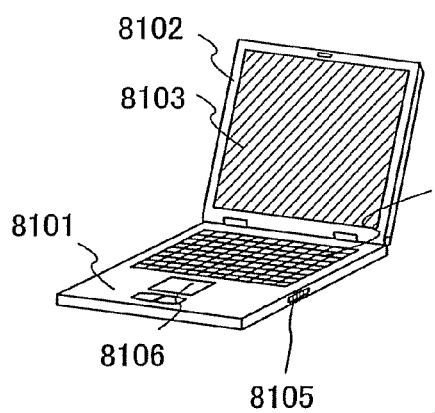

FIG. 15B illustrates a notebook personal computer including a main body 8101, a chassis 8102, a display portion 8103, a keyboard 8104, an external connection port 8105, a pointing mouse 8106, and the like. The notebook personal computer is manufactured by using a light-emitting device manufactured using the film formation apparatus of the present invention for the display portion 8103. The film formation apparatus enables a huge reduction in manufacturing cost to provide inexpensive notebook personal computers. Furthermore, in the manufacturing apparatus of the present invention, excellent film thickness uniformity that is less than 3% is realized, and therefore desired film thickness can be obtained to reduce display variations in a light-emitting device.

Figure 15C:
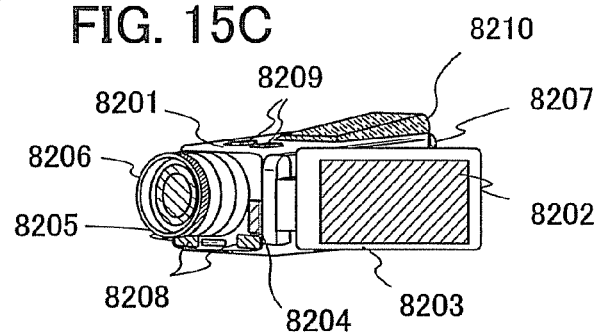

FIG. 15C illustrates a video camera including a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The video camera is manufactured by using a light-emitting device manufactured using the film formation apparatus of the present invention for the display portion 8202. The film formation apparatus enables a huge reduction in manufacturing cost to provide inexpensive video cameras. Furthermore, in the manufacturing apparatus of the present invention, excellent film thickness uniformity that is less than 3% is realized, and therefore desired film thickness can be obtained to reduce display variations in a light-emitting device.

Figure 15D:
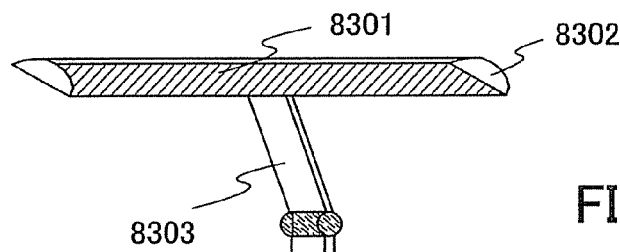

FIG. 15D illustrates a desk lamp including a lighting portion 8301, a shade 8302, an adjustable arm 8303, a support 8304, a base 8305, and a power supply 8306. The desk lamp is manufactured by using a light-emitting device manufactured using the film formation apparatus of the present invention for the lighting portion 8301. It is to be noted that the lighting equipment includes a ceiling light, a wall light, and the like. The film formation apparatus enables a huge reduction in manufacturing cost to provide inexpensive lighting equipments. Furthermore, in the manufacturing apparatus of the present invention, excellent film thickness uniformity that is less than 3% is realized, and therefore desired film thickness can be obtained to reduce display variations in a light-emitting device.

Figure 15E:
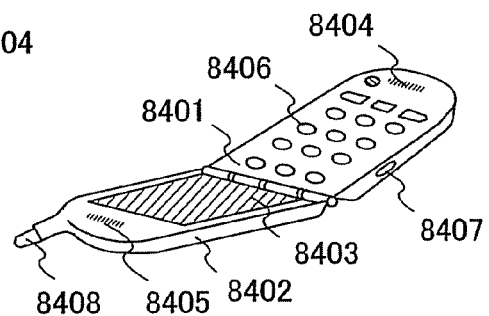

FIG. 15E illustrates a portable phone including a main body 8401, a chassis 8402, a display portion 8403, an audio input portion 8404, an audio output portion 8405, operation keys 8406, an external connection port 8407, an antenna 8408, and the like. The portable phone is manufactured by using a light-emitting device manufactured using the film formation apparatus of the present invention for the display portion 8403. The film formation apparatus enables a huge reduction in manufacturing cost to provide inexpensive portable phones. Furthermore, in the manufacturing apparatus of the present invention, excellent film thickness uniformity that is less than 3% is realized, and therefore desired film thickness can be obtained to reduce display variations in a light-emitting device.

In the above-described manner, an electronic appliance or lighting equipment using a light-emitting device manufactured using the film formation apparatus of present invention can be obtained. The applicable range of the light-emitting device manufactured using the film formation apparatus of the present invention is so wide that the light-emitting device can be applied to electronic appliances in various fields.

It is to be noted that the light-emitting device described in this embodiment can be freely combined with the film formation apparatuses each described in Embodiment Modes 1 to 3 or a film formation method described in Embodiment Mode 4 as well as with any one of Embodiments 1 to 3.

Embodiment 5

Figure 16A:
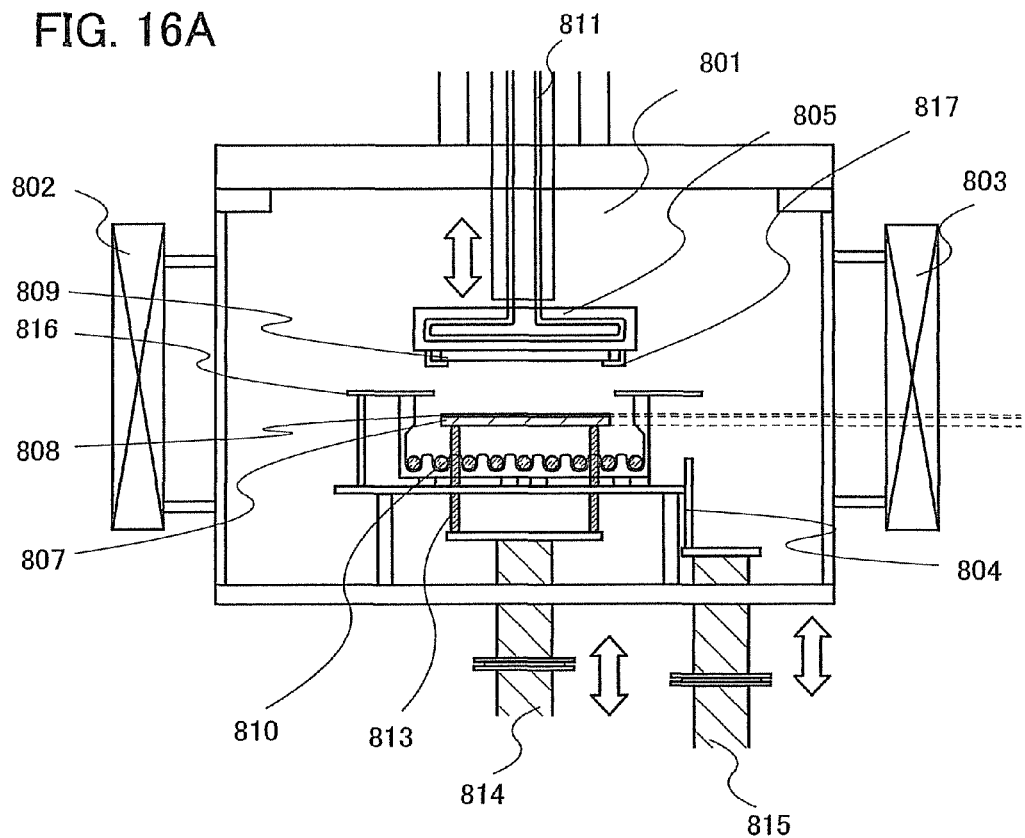
FIGS. 16A and 16B are views illustrating examples of a film formation apparatus.
Figure 16B:
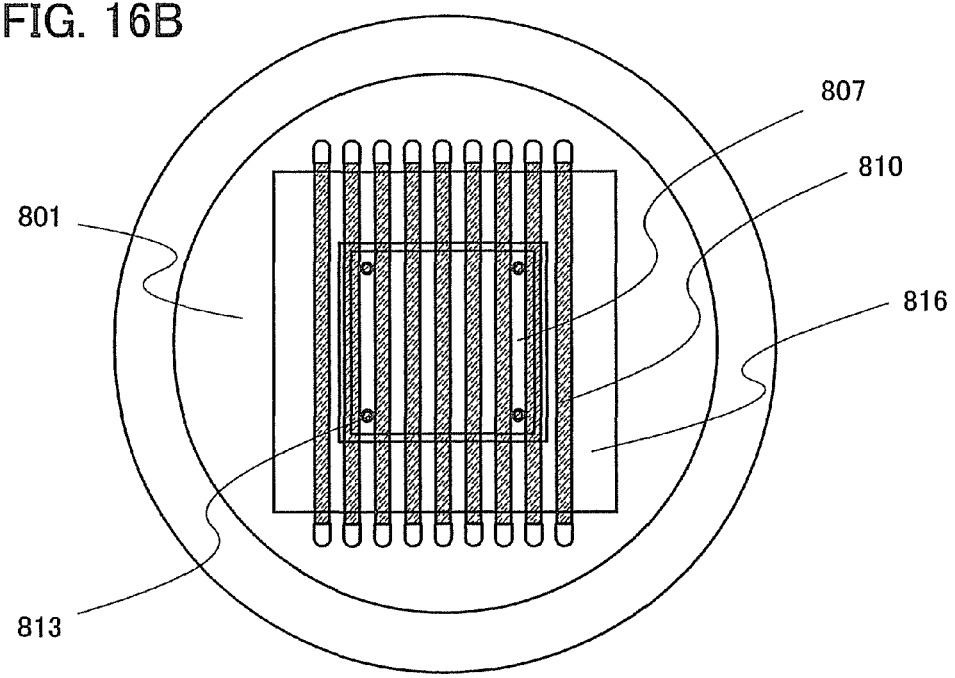

In this embodiment, an example of the film formation apparatus of the present invention will be described with reference to FIGS. 16A and 16B, and FIG. 17. FIG. 16A and 16B are a cross-sectional view and a top view, respectively, of the film formation apparatus.

In FIG. 16A, a film formation chamber 801 is a vacuum chamber and connected to other treatment chambers through a first gate valve 802 and a second gate valve 803. In the film formation chamber 801, at least, a substrate supporting mechanism 813 which is a first substrate supporting unit, a supporting mechanism 805 of a substrate on which a material layer 808 is to be formed (formation substrate), which is a second substrate supporting unit, and a halogen lamp 810 as a heat source 106 are included. The halogen lamp 810 enables rapid heating and can control heating of a first substrate 807 by changing the interval of time for emitting light. In addition, since the halogen lamp 810 enables rapid heating, a vertical mechanism, a shutter, and the like for a case of using a heater are not necessarily provided. Thus, the film formation apparatus can be further miniaturized.

First, in the other film formation chamber, a material layer 808 is formed on the first substrate 807 that is a supporting substrate. In this embodiment, a glass substrate over which a titanium film is formed is used as the first substrate 807. Titanium can efficiently absorb light having an emission wavelength of anout 1100 to 1200 nm corresponding to the wavelength of the halogen lamp 810 that is a heat source; thus the material layer 808 formed on the titanium film can be efficiently heated. For the material layer 808, a layer that can be subjected to evaporation and is formed of a stack of a plurality of materials having different evaporation temperatures is used. It is to be noted that, in this embodiment, a substrate that has the same area as the formation substrate is used as the first substrate 807. Besides, in this embodiment, in the material layer 808, a layer containing metal oxide is stacked by a wet method on a layer containing a substance having a high hole transporting property. It is difficult to dissolve the metal oxide and the substance having a high hole transporting property in the same solvent and to control this mixed solution; therefore, it is further difficult to directly form a mixed layer by a wet method. Hence, stacking the layer containing metal oxide on the layer containing a substance having a high hole transporting property by a wet method is easier. Thus, the mixed layer can be easily formed by film formation method of the present invention.

As indicated by a dotted line in FIG. 16A, the first substrate 807 is transferred from the other film formation chamber to the film formation chamber 801 to be set on the substrate supporting mechanism 813. In the transfer, when a reflector shutter 804 is opened by a movable unit 815, the first substrate 807 can be set on the substrate supporting mechanism 813. The first substrate 807 is fixed to the first substrate supporting mechanism 813 so that a surface of the first substrate 807, on which the material layer 808 is formed, faces a surface (formation surface) of the second substrate 809 that is a formation substrate, on which the material layer 808 is to be formed.

The film formation chamber 801 is desirably subjected to vacuum evacuation. Specifically, vacuum evacuation is preformed until the value of the vacuum satisfies less than or equal to $5\times10^{-3}$ Pa, preferably in a range of $10^{-4}$ to $10^{-6}$ Pa, inclusive. As a vacuum evacuation unit provided to be connected to the film formation chamber, the pressure of from the atmosphere to approximately 1 Pa is evacuated by an oil-free dry pump, and the pressure of approximately 1 or more Pa is evacuated by a magnetic levitation turbo molecular pump or a complex molecule pump. Accordingly, pollution by an organic material such as oil from the evacuation unit is prevented. An inner wall surface is subjected to mirror surface treatment by electrochemical polishing to reduce its surface area so that gas discharge is prevented.

The second substrate 809 is fixed by a fixing unit 817 to the supporting mechanism 805 of the formation substrate. The supporting mechanism 805 of the formation substrate includes a tube 811 by which a heat medium flows. The tube 811 by which a heat medium flows can maintain the appropriate temperature in the supporting mechanism 805 of the formation substrate. For example, by the tube 811, cold water may flow to cool the formation substrate or warm water may flow to heat it Next, as illustrated in FIG. 17, the first substrate 807 and the second substrate 809 are approached to each other so that the distance therebetween becomes a distance d. It is to be noted that the distance d is determined as a distance between a surface of the material layer 808 formed on the first substrate 807 and a surface of the second substrate 809. In a case where a certain layer (e.g., a conductive layer that functions as an electrode or an insulating layer that functions as a partition wall) is formed on the second substrate 809, the distance d is determined as the distance between the surface of the material layer 808 formed on the first substrate 807 and the surface of the layer formed on the second substrate 809. It is to be noted that, in a case where the second substrate 809 or the layer formed on the second substrate 809 has unevenness in its surface, the distance d is determined as the shortest distance between the surface of the material layer 808 formed on the first substrate 807 and the surface of the layer formed on the second substrate 809 or the surface of the second substrate 809. The distance d that is a distance between the substrates of the apparatus illustrated in FIGS. 16A and 16B and FIG. 17 can be reduced until the substrate distance d becomes 0.5 mm which is the lower limit. Further, in a case where an electrostatic chuck is used to prevent the second substrate 809 from wrapping and bending, the lower limit of the distance d can be set to 0.01 mm even if either a glass substrate or a quartz substrate is used.

In the film formation apparatus described in this embodiment, the distance between the first substrate 807 and the second substrate 809 is controlled by vertical movement of the supporting mechanism 805 of the formation substrate or by vertical movement of substrate lift pins that are the first substrate supporting mechanism 813 with the first substrate 807 lifted up. The substrate lift pins are vertically moved by the movable unit 814 to lift up the first substrate 807.

In this embodiment, the first substrate 807 (supporting substrate) and the halogen lamp 810 which is a heat source have a distance of 50 mm therebetween at the time of waiting (before evaporation treatment) in order to relieve thermal effects that radiation of the heat source (heater) has on the material layer 808 on the first substrate 807 (supporting substrate) at this time.

Heat treatment is performed using the halogen lamp 810 while retaining the distance d. First, as preliminary heating, an output of the halogen lamp 810 is maintained at a temperature of 60° C. for 15 seconds. The preliminary heating stabilizes the output of the halogen lamp 810. Thereafter, heat treatment is performed. The heat treatment is maintained at a temperature of 500 to 800° C. for 7 to 15 seconds. Because time taken for the heat treatment varies depending on an evaporation material, it is appropriately determined. A reflector 816 and the reflector shutter 804 are provided so that the whole film formation chamber is not heated by scattering of light from the halogen lamp 810.

The titanium film formed on the first substrate 807 absorbs light from the halogen lamp 810 and the titanium film is heated; accordingly, the material layer 808 on the titanium film is heated to be evaporated and then an evaporation material is formed on the formation surface (i.e., lower flat surface) of the second substrate 809, which is disposed to face the surface of material layer 808. In the film formation apparatus illustrated in FIGS. 16A and 16B, and FIG. 17, when the material layer with a uniform film thickness is obtained on the first substrate 807 beforehand, film formation with high uniformity is possible on the second substrate 809 without using a film thickness monitor. A substrate is rotated in a conventional evaporation apparatus. In contrast, the formation substrate is fixed for film formation in the film formation apparatus illustrated in FIGS. 16A and 16B, and FIG. 17; thus this film formation apparatus is suitable for film formation of a large-area glass substrate that is easy to be broken. In addition, in the film formation apparatus in FIGS. 16A and 16B, and FIG. 17, the supporting substrate is also stopped among film formation.

The film formation apparatus of this embodiment enables manufacture of the light-emitting device in accordance with the present invention. In the present invention, an evaporation source can be easily prepared by a wet method. Furthermore, the evaporation source can be directly subjected to evaporation to eliminate a film thickness monitor. Therefore, the whole film formation process can be automated to improve throughput. Moreover, the evaporation material can be prevented from attaching to an inner wall of a film formation chamber to simplify maintenance of a film formation apparatus.

It is to be noted that the film formation apparatus of the embodiment can be freely combined with the film formation apparatuses of Embodiment Modes 1 to 3.

Embodiment 6

Figure 17:
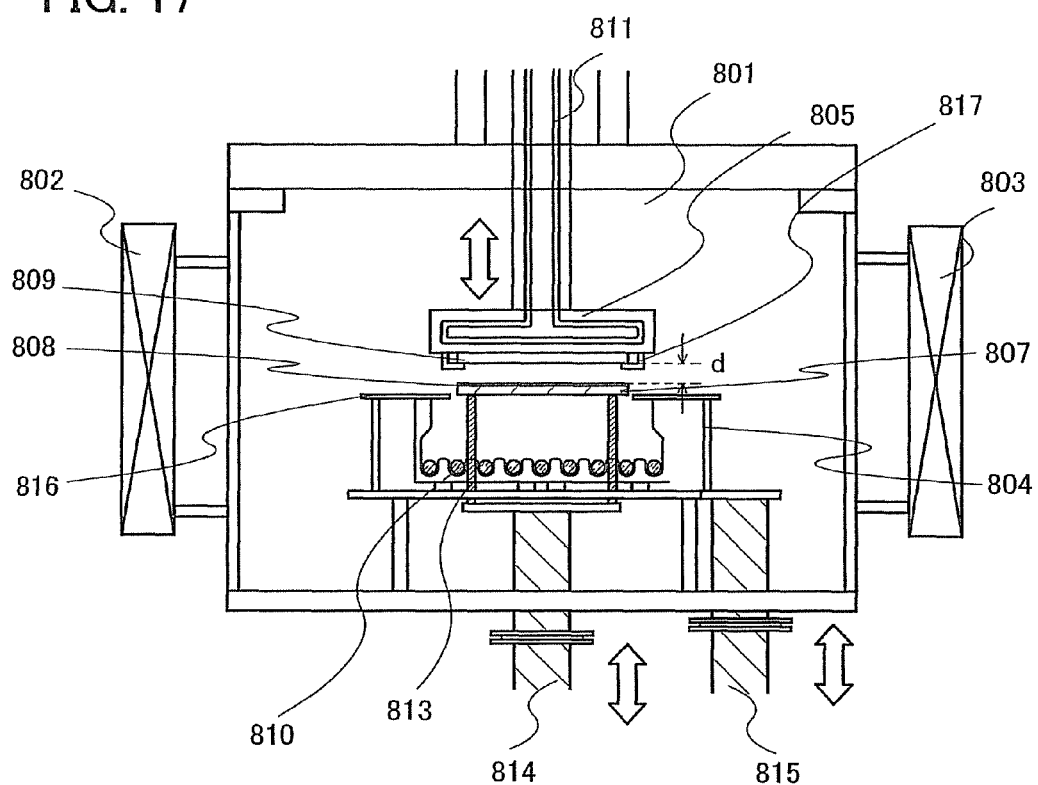
FIG. 17 is a view illustrating an example of a film formation apparatus.

An experiment to compare uniformity of film formation was performed using the film formation apparatus illustrated in FIGS. 16A and 16B, and FIG. 17.

First, by spin coating, a material solution containing Alq was dropped onto a first substrate and the first substrate was rotated (1000 rpm, film formation time of 33 seconds) to form a first organic layer. As the material solution containing Alq, a material solution in which Alq is dispersed in chloroform that is used as a solvent was prepared. The weight ratio (chloroform: Alq) was set to 1:0.0025.

Then, the periphery of the first substrate was wiped with a cloth soaked with acetone to remove the first organic layer in the periphery of the first substrate 807.

The result of film thickness measurement that was performed at nine points on an area having 8 cm×8 cm on the first organic layer formed on the first substrate is shown below.

The measurement result at nine points on the first organic layer formed on the first substrate was: 22.2 nm at the first point, 23.4 nm at the second point, 23.1 nm at the third point, 22.6 nm at the forth point, 24.8 nm at the fifth point, 23.5 nm at the sixth point, 22.5 nm at the seventh point, 21.3 nm at the eighth point, and 23.1 nm at the ninth point.

The average film thickness calculated from the measurement result was 22.94 nm and the film thickness distribution was 7.59%.

Next, a glass substrate was prepared as a second substrate and it was disposed to face the surface of the first substrate, on which the first organic layer has been formed. The distance d between the first substrate and the second substrate was set to 1 mm. Then, heat was applied by a lamp for 12 seconds.

After the heating, a second organic layer with uniform film thickness was formed on the second substrate. The result of film thickness measurement that was performed at nine points on an area having 8 cm×8 cm on the second organic layer formed on the second substrate is shown below.

The measurement result at nine points on the first organic layer formed on the second substrate was: 21.8 nm at the first point, 22.2 nm at the second point, 22.5 nm at the third point, 22.8 nm at the forth point, 22.2 nm at the fifth point, 22.3 nm at the sixth point, 22.5 nm at the seventh point, 22.8 nm at the eighth point, and 22.8 nm at the ninth point.

Average film thickness calculated from the measurement result is 22.43 nm and the film thickness distribution is 2.24%.

Thus, by using the film formation apparatus of the present invention, film thickness distribution of the second organic layer formed on the second substrate can be set to less than ±3%.

Embodiment 7

In this embodiment, an experiment was performed for confirming a state of film formation while setting a condition for the distance d in a case where the film formation apparatus described in Embodiment 6 was used for the film formation.

A titanium film (a thickness of 400 nm) was formed on the first substrate, and a NPB film was formed thereon with a thickness of 50 nm.

The first substrate and the second substrate were each disposed with the distance d therebetween in the apparatus of FIGS. 16A and 16B and FIG. 17. Film formation was performed on the second substrate by heat treatment using a halogen lamp for 8 seconds.

Three conditions (1 mm, 300 µm, and 50 µm) for the distance d were set to perform the film formation on the second substrate under each of these conditions.

Figure 18:
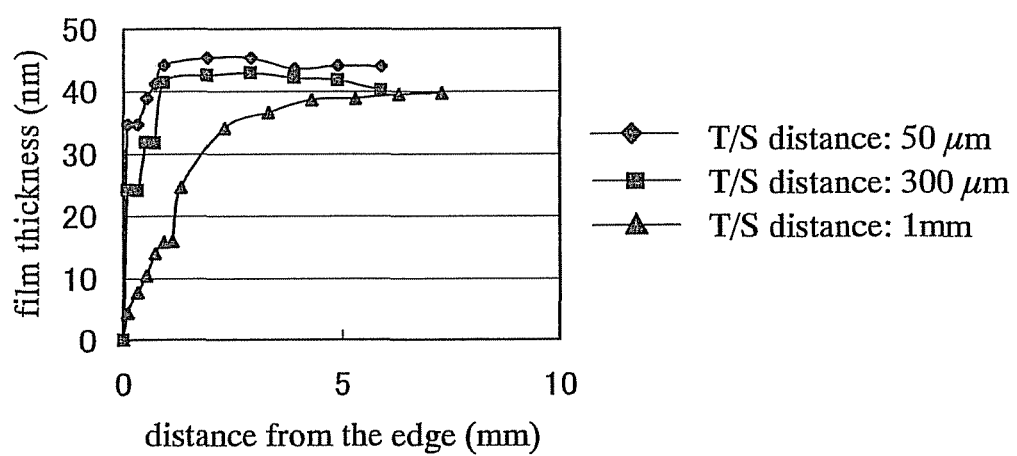
FIG. 18 is a graph illustrating film thickness distribution from an edge of a film formation pattern.

FIG. 18 illustrates the measurement result. In FIG. 18, an edge of a film formation pattern formed using the NPB film obtained on the second substrate has a distance of 0, a distance (mm) from the edge is indicated by the horizontal axis, and film thickness (nm) is indicated by the vertical axis.

It is found that, in a case where the distance d is 1 mm, the film thickness increased from the edge of the film toward the center thereof and the increasing amount is up to about 6 mm. Since a thin film to be used for a light-emitting element preferably has uniform film thickness, a light-emitting element is manufactured in a region other than the region having unevenness of up to 6 mm from the edge in a case of performing film formation with the distance d of 1 mm.

On the other hand, in a case where the distance d is less than 1 mm, that is, the distance d is 300 μm or 50 μm, unevenness of the film thickness is as small as about 0.5 mm from the edge. Thus, as the distance d decrease, it is possible to increase a region having uniform film thickness, on which a light-emitting element can be manufactured, and to use a material efficiently.

From the result in FIG. 18, it is observed that the thickness of the NPB film formed on the second substrate increases as the distance d decreases. This shows that the NPB film was formed with a thickness of close to 50 nm on the second substrate by using the NPB film that was formed with a thickness of 50 nm on the first substrate. That is, it is said that loss of a film formation material can be reduced according as the distance d decreases. In this embodiment, the experiment was performed for confirming a state of film formation while setting a condition for the distance d in a case where the film formation apparatus described in Embodiment 6 was used for the film formation.

A titanium film (a thickness of 400 nm) was formed on the first substrate, and a NPB film was formed thereon with a thickness of 50 nm. The NPB film was formed using a 5-inch substrate as the first substrate on an area of 108 mm×108 mm.

The first substrate and the second substrate were each disposed with the distance d therebetween in the apparatus of FIGS. 16A and 16B and FIG. 17. Film formation was performed on the second substrate by heat treatment using a halogen lamp for 8 seconds.

Three conditions (1 mm, 300 μm, and 50 μm) for the distance d were set to perform the film formation on the second substrate under each of the conditions.

FIG. 18 illustrates the measurement result. In FIG. 18, an edge of a film formation pattern formed using the NPB film obtained on the second substrate has a distance of 0, a distance (mm) from the edge is indicated by the horizontal axis, and film thickness (nm) is indicated by the vertical axis.

The T/S distance described in FIG. 18 is a parameter corresponding to the distance d. It is found that, in a case where the distance d is 1 mm, the film thickness increased from the edge of the film toward the center thereof and the increasing amount is up to about 6 mm. Since a thin film to be used for a light-emitting element preferably has uniform film thickness, a light-emitting element is manufactured in a region other than the region having unevenness of up to 6 mm from the edge in a case of performing film formation with the distance d of 1 mm.

On the other hand, in a case where the distance d is less than 1 mm, that is, the distance d is 300 μm or 50 μm, unevenness of the film thickness is as small as about 0.5 mm from the edge. Thus, as the distance d decreases, it is possible to increase a region having uniform film thickness, on which a light-emitting element can be manufactured, and to use a material efficiently.

From the result in FIG. 18, it is observed that the thickness of the NPB film formed on the second substrate increases as the distance d decreases. This shows that the NPB film was formed with a thickness of close to 50 nm on the second substrate by using the NPB film that was formed with a thickness of 50 nm on the first substrate. That is, it is said that loss of a film formation material can be reduced according as the distance d decreases.

This application is based on Japanese Patent Application serial no. 200-328472 filed with Japan Patent Office on Dec. 5, in 2006, the entire contents of which are hereby incorporated by reference.

EXPLANATION OF REFERENCE

101: film formation chamber, 102: first gate valve, 103: second gate valve, 104: first substrate supporting unit, 105: second substrate supporting unit, 106: heat source, 107: first substrate, 108: material layer, 109: second substrate, 110: lamp, 111: tube, 201: film formation chamber, 202: first gate valve, 203: second gate valve, 204: second substrate supporting unit, 205: first substrate supporting unit, 206: heat source, 207: second substrate, 208: material layer, 209: first substrate, 210: lamp, 301: film formation chamber, 304: first substrate supporting unit, 305: second substrate supporting unit, 306: heat source, 307: first substrate, 308: material layer, 309: second substrate, 310: lamp: 400: second material layer, 406: heat source, 407: first substrate, 408: first material layer, 409: second material layer, 413: head, 506: heat source, 507: first substrate, 508: first material layer, 509: second substrate, 518: thermal conductive layer, 519: first material layer, 520: first material layer, 701: first load chamber, 702: first film formation chamber, 703: first gate valve, 704: second gate valve, 705: first stock chamber, 706: second stock chamber, 707: third valve, 708: fourth gate valve 710: fifth gate valve, 712: second film formation chamber, 713: fifth gate valve, 714: sixth gate valve, 715: unload chamber, 716: cassette, 717: transfer robot, 718: stage, 719: nozzle, 720: plate, 721: material layer, 722: hot plate, 723: transfer robot, 724: plate stock holder, 725: transfer robot, 726: cassette, 727: transfer robot, 728: transfer robot, 729: mask stock holder, 730: cassette, 733: mask, 734: plate supporting base, 735: second substrate supporting base, 736: heat source, 739: second substrate, 801: transfer chamber, 802: first gate valve, 803: second gate valve, 804: reflector shutter, 805: second supporting mechanism, 807: first substrate, 808: material layer, 809: second substrate, 810: halogen lamp, 811: tube, 813: substrate supporting mechanism, 814: movable unit, 815: movable unit, 816: reflector, 817: fixing unit, 1100: alignment control portion, 1101: stage position control portion, 1102: monitor, 1103: control portion, 1120: imaging unit, 1121: head, 1122: stage, 1123: ink bottle, 1124: substrate, 1125: droplet discharge unit, 1501: first substrate, 1504: insulating film, 1513: first electrode, 1514: partition wall, 1515R, 1515G, and 1515B: stacked film including light-emitting layer, 1516: second electrode, 1521: light-emitting region, 1522: inversely tapered partition wall, 1601: first substrate, 1602: data line, 1603: scanning line, 1604: partition wall, 1605: region, 1607: input terminal, 1608: connection wiring, 1609a, 1609b: FPC, 1700: layer containing organic compound, 1701: source side driving circuit, 1702: pixel portion, 1703: gate driving circuit, 1704: sealing substrate, 1705: sealant, 1707: space, 1709: flexible printed circuit (FPC), 1710: element substrate, 1711: TFT for switching, 1712: TFT for controlling current, 1713: anode, 1714: insulator, 1715: light-emitting element, 1716: cathode, 1723: n-channel TFT, 1724: p-channel TFT, 8001: chassis, 8002: supporting base, 8003: display portion, 8004: speaker portion, 8005: video input portion, 8101: body, 8102: chassis, 8103: display portion, 8104: keyboard, 8105: external connection port, 8201: body, 8202: display portion, 8203: chassis, 8204: external connection port, 8205: remote control receiving portion, 8206: image receiving portion, 8207: battery, 8208: audio input portion, 8209: operation key, 8301: lighting portion, 8302: shade, 8303: adjustable arm, 8304: support, 8305: base, 8306: power supply, 8401: body, 8402: chassis, 8403: display portion, 8404: audio input portion, 8405: audio output portion, 8406: operation key, 8407: external connection port, and 8408: antenna.

The invention claimed is:

1. A film formation apparatus comprising:
a film formation chamber;
a heat source provided in the film formation chamber;
a first supporting unit to hold a first substrate over the heat source;
a shutter provided between the heat source and the first substrate; and
a second supporting unit to hold a second substrate over the first supporting unit,
wherein the heat source is a lamp,
wherein the lamp is capable of moving to adjust a heating temperature, and
wherein the second supporting unit is capable of moving to adjust a distance between the first substrate and the second substrate.

2. The film formation apparatus according to claim 1, further comprising a vacuum evacuation treatment chamber to evacuate the film formation chamber.

3. The film formation apparatus according to claim 1, further comprising a cooling unit to cool the second substrate.

4. The film formation apparatus according to claim 1, further comprising a heating unit to heat the second substrate.

5. The film formation apparatus according to claim 1, further comprising an alignment unit to adjust a position of a mask and the second substrate in the film formation chamber.

6. The film formation apparatus according to claim 1, further comprising a sensor to measure humidity in the film formation chamber.

7. The film formation apparatus according to claim 1, wherein the distance between the first substrate and the second substrate is more than or equal to 0.5 mm and less than or equal to 5 mm.

8. The film formation apparatus according to claim 1, wherein the shutter is capable of insulating heat from the heat source to the first substrate.

9. A manufacturing apparatus comprising:
a load chamber;
a first film formation chamber connected to the load chamber;
a transfer chamber connected to the first film formation chamber;
a second film formation chamber connected to the transfer chamber;
an unload chamber connected to the second film formation chamber,
a coating device provided in the first film formation chamber;
a heat source provided in the second film formation chamber;
a first supporting unit to hold a first substrate over the heat source;
a shutter provided between the heat source and the first substrate; and
a second supporting unit to hold a second substrate, disposed to face the first supporting unit,
wherein the first substrate is introduced from the load chamber to the first film formation chamber,
wherein a layer containing a material is coated onto the first substrate in the first film formation chamber,
wherein the first substrate is introduced from the first film formation chamber to the second film formation chamber through the transfer chamber,
wherein the first substrate is disposed in the second film formation chamber, the first substrate facing the second substrate,
wherein the layer is formed on a surface of the second substrate disposed to face the first substrate, and
wherein the second substrate provided with the layer is transferred to the unload chamber
wherein the heat source is a lamp,
wherein the lamp is capable of moving to adjust a heating temperature, and
wherein the second supporting unit is capable of moving to adjust a distance between the first substrate and the second substrate.

10. The manufacturing apparatus according to claim 9, further comprising a vacuum evacuation treatment chamber to evacuate the second film formation chamber.

11. The manufacturing apparatus according to claim 9, further comprising a cooling unit to cool the second substrate.

12. The manufacturing apparatus according to claim 9, further comprising a heating unit to heat the second substrate.

13. The manufacturing apparatus according to claim 9, further comprising an alignment unit to adjust a position of a mask and the second substrate in the second film formation chamber.

14. The manufacturing apparatus according to claim 9, further comprising a sensor to measure humidity in the second film formation chamber.

15. The manufacturing apparatus according to claim 9, wherein the distance between the first substrate and the second substrate is more than or equal to 0.5 mm and less than or equal to 5 mm.

16. The manufacturing apparatus according to claim 9, wherein the shutter is capable of insulating heat from the heat source to the first substrate.

* * * * *